(12) United States Patent

Ng et al.

(10) Patent No.: US 9,575,409 B2
(45) Date of Patent: Feb. 21, 2017

(54) PHOTOIMAGEABLE COMPOSITIONS CONTAINING OXETANE FUNCTIONALITY

(71) Applicant: PROMERUS, LLC, Brecksville, OH (US)

(72) Inventors: Hendra Ng, Brecksville, OH (US); Wei Zhang, Brecksville, OH (US)

(73) Assignee: PROMERUS, LLC, Brecksville, OH (US)

( * ) Notice: Subject to any disclaimer, the term of this patent is extended or adjusted under 35 U.S.C. 154(b) by 0 days.

(21) Appl. No.: 14/946,843

(22) Filed: Nov. 20, 2015

(65) Prior Publication Data

US 2016/0147145 A1  May 26, 2016

Related U.S. Application Data

(60) Provisional application No. 62/084,619, filed on Nov. 26, 2014.

(51) Int. Cl.
*G03F 7/038* (2006.01)
*G03F 7/075* (2006.01)
*G03F 7/004* (2006.01)
*G03F 7/32* (2006.01)

(52) U.S. Cl.
CPC ............. *G03F 7/038* (2013.01); *G03F 7/0045* (2013.01); *G03F 7/0046* (2013.01); *G03F 7/0382* (2013.01); *G03F 7/0388* (2013.01); *G03F 7/0751* (2013.01); *G03F 7/0755* (2013.01); *G03F 7/325* (2013.01)

(58) Field of Classification Search
USPC ............................................ 430/270.1, 280.1
See application file for complete search history.

(56) References Cited

U.S. PATENT DOCUMENTS

| 2010/0150506 A1* | 6/2010 | Maeda | C08F 232/08 430/270.1 |
| 2011/0070543 A1* | 3/2011 | Knapp | C08F 232/08 430/280.1 |
| 2011/0286713 A1* | 11/2011 | Mori | C08G 65/18 385/141 |
| 2012/0129101 A1* | 5/2012 | Onishi | G03F 7/0382 430/283.1 |
| 2013/0181199 A1* | 7/2013 | Apanius | C08F 232/08 257/40 |

FOREIGN PATENT DOCUMENTS

| JP | 2008-286877 A | * 11/2008 |
| JP | 2009-198962 A | * 9/2009 |
| JP | 2010-256826 A | * 11/2010 |

OTHER PUBLICATIONS

English translation of JP, 2008-286877 A (2008) from machine translation from AIPN Japan Patent Office National Center for Industrial Property Information and Training, generated Mar. 30, 2016,15 pages.*
English abstract of JP 2008-286877 a along with some of the compounds attached by Chemical astracts Registry Number servies to the abstract thereof obtained from SciFinder database and identified as 2008:1427395 or CAN 149:586357 in CAPLUS copyright American Chemical SOciety downloaded Mar. 2016.*
English translation of JP, 2010-256826 A (2010) from machine translation from AIPN Japan Patent Office National Center for Industrial Property Information and Training, generated Mar. 31, 2016, 15 pages.*
English translation of JP, 2009-198962 A (2009) from machine translation from AIPN Japan Patent Office National Center for Industrial Property Information and Training, generated Mar. 31, 2016, 15 pages.*

* cited by examiner

*Primary Examiner* — Cynthia Hamilton
(74) *Attorney, Agent, or Firm* — Balaram Gupta

(57) ABSTRACT

Embodiments in accordance with the present invention encompass negative-tone, solvent developable, self-imageable polymer compositions useful for forming films that can be patterned to create structures for microelectronic devices, microelectronic packaging, microelectromechanical systems, optoelectronic devices and displays.

17 Claims, No Drawings

PHOTOIMAGEABLE COMPOSITIONS CONTAINING OXETANE FUNCTIONALITY

CROSS REFERENCE TO RELATED APPLICATIONS

This application claims the benefit of U.S. Provisional Application No. 62/084,619, filed Nov. 26, 2014, which is incorporated herein by reference in its entirety.

BACKGROUND OF THE INVENTION

Field of the Invention

Embodiments in accordance with the present invention relate generally to photoimageable compositions containing certain oxetane compounds or polymers having such functional groups for forming microelectronic and/or optoelectronic devices and assemblies thereof, and more specifically to compositions encompassing polynorbornene (PNB) polymers having norbornene-type repeating units that exhibit improved mechanical properties.

Description of the Art

Organic polymer materials are increasingly being used in the microelectronics and optoelectronics industries for a variety of applications. For example, the uses for such organic polymer materials include interlevel dielectrics, redistribution layers (RDL), stress buffer layers, chip stacking and/or bonding, leveling or planarization layers, alpha-particle barriers, passivation layers, among others in the fabrication of a variety of microelectronic and optoelectronic devices. Where such organic polymer materials are photosensitive, thus self-imageable, and therefore, offer additional advantage of reducing the number of processing steps required for the use of such layers and structures made therefrom. Additionally, such organic polymer materials enable the direct adhesive bonding of devices and device components to form various structures. Such devices include microelectromechanical systems (MEMS), microoptoelectromechanical systems (MOEMS) and the semiconductor device encompassing a complementary metal oxide semiconductor (CMOS) image sensor dam structure, and the like.

While certain of the currently available organic photosensitive compositions are used in some of the aforementioned applications, there is still a need for organic photosensitive compositions which feature improved mechanical properties especially in such applications as RDL, chip stacking/bonding and CMOS, where organic materials with higher modulus and tensile strength provide better advantages in fabricating the devices.

Accordingly, there is still a need to develop self imageable photosensitive polymer compositions which feature desirable mechanical properties, i.e., featuring higher tensile strength and modulus with no negative effect on percent elongation while maintaining good stress buffer property and also exhibit high photospeed, bond adhesion, improved thermal oxidative stability and most importantly integration into all involved process steps. Also, it is desirable to process such materials in commonly used solvents.

SUMMARY OF THE INVENTION

It has now been found that by proper selection of a photoimageable composition it is now possible to fabricate a semiconductor device which features hitherto unachievable mechanical properties, i.e., higher tensile strength and modulus with no negative effect on percent elongation while maintaining good stress buffer property and also exhibit high photospeed, bond adhesion, improved thermal oxidative stability yet can be readily integrated into conventional applications, to such as for example CMOS image sensor (CIS) applications or redistribution layer (RDL) applications, and the like.

Accordingly, there is provided a photoimageable solvent developable negative tone composition comprising:

a) a polymer having one or more repeating units of formula (IA) derived from a monomer of formula (I):

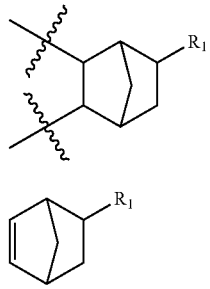

wherein ⌇⌇⌇ represents a position at which the bonding takes place with another repeat unit;

$R_1$ is $(C_6-C_{18})$alkyl, perfluoro$(C_1-C_{18})$alkyl, $(C_6-C_{10})$aryl$(C_1-C_6)$alkyl or $-(CH_2)_a-CO_2R_2$ where a is an integer from 0 to 4, and $R_2$ is hydrogen or $(C_1-C_4)$alkyl;

b) a compound of the formula (III):

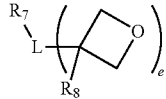

wherein e is an integer from 1 to 4;

L is a bond or a divalent linking or a spacer group selected from ether, ketone, amine, sulfide, sulfone, ester or an amide group;

$R_7$ is a core organic moiety selected from an aliphatic or an aromatic group;

$R_8$ is $(C_1-C_4)$alkyl;

c) a photoactive compound; and d) a carrier solvent.

In another aspect of this invention there is also provided a photoimageable solvent developable negative tone composition comprising:

a) a polymer having a repeat unit of formula (IVA) derived from a monomer of formula (IV):

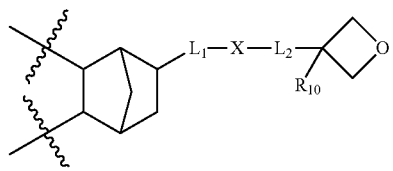

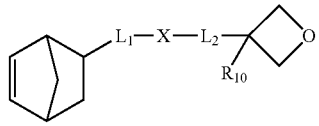

wherein ⌇⌇⌇ represents a position at which the bonding takes place with another repeat unit;

$L_1$ and $L_2$ are the same or different and each independently of one another is selected from a bond or a divalent alkylene or arylene group;

X is selected from:
—O—, —S—, —CO—, —$NR_{11}$—, —COO— or —OCO—, —$CONR_{11}$— or —$NR_{11}CO$—, —$SiR_{12}R_{13}O$—, —$SO_2$—, —$OSO_2$— or —$SO_2O$—, where $R_{11}$, $R_{12}$ and $R_{13}$ are the same or different and each independently of one another is $(C_1$-$C_4)$alkyl;

$R_{10}$ is $(C_1$-$C_4)$alkyl;

b) a photoactive compound; and c) a carrier solvent.

DETAILED DESCRIPTION

The terms as used herein have the following meanings:

As used herein, the articles "a," "an," and "the" include plural referents unless otherwise expressly and unequivocally limited to one referent.

Since all numbers, values and/or expressions referring to quantities of ingredients, reaction conditions, etc., used herein and in the claims appended hereto, are subject to the various uncertainties of measurement encountered in obtaining such values, unless otherwise indicated, all are to be understood as modified in all instances by the term "about."

Where a numerical range is disclosed herein such range is continuous, inclusive of both the minimum and maximum values of the range as well as every value between such minimum and maximum values. Still further, where a range refers to integers, every integer between the minimum and maximum values of such range is included. In addition, where multiple ranges are provided to describe a feature or characteristic, such ranges can be combined. That is to say that, unless otherwise indicated, all ranges disclosed herein are to be understood to encompass any and all sub-ranges subsumed therein. For example, a stated range of from "1 to 10" should be considered to include any and all sub-ranges between the minimum value of 1 and the maximum value of 10. Exemplary sub-ranges of the range 1 to 10 include, but are not limited to, 1 to 6.1, 3.5 to 7.8, and 5.5 to 10, etc.

As used herein, the symbol "∿" denotes a position at which the bonding takes place with another repeat unit or another atom or molecule or group or moiety as appropriate with the structure of the group as shown.

As used herein, "hydrocarbyl" refers to a group that contains carbon and hydrogen atoms, non-limiting examples being alkyl, cycloalkyl, aryl, aralkyl, alkaryl, and alkenyl. The term "halohydrocarbyl" refers to a hydrocarbyl group where at least one hydrogen has been replaced by a halogen. The term perhalocarbyl refers to a hydrocarbyl group where all hydrogens have been replaced by a halogen.

As used herein, the expression "$(C_1$-$C_6)$alkyl" includes methyl and ethyl groups, and straight-chained or branched propyl, butyl, pentyl and hexyl groups. Particular alkyl groups are methyl, ethyl, n-propyl, isopropyl and tert-butyl. Derived expressions such as "$(C_1$-$C_4)$alkoxy", "$(C_1$-$C_4)$thioalkyl" "$(C_1$-$C_4)$alkoxy$(C_1$-$C_4)$alkyl", "hydroxy$(C_1$-$C_4)$alkyl", "$(C_1$-$C_4)$alkcylcarbonyl", "$(C_1$-$C_4)$alkoxycarbonyl$(C_1$-$C_4)$alkyl", "$(C_1$-$C_4)$alkoxycarbonyl", "amino$(C_1$-$C_4)$alkyl", "$(C_1$-$C_4)$alkylamino", "$(C_1$-$C_4)$alkylcarbamoyl$(C_1$-$C_4)$alkyl", "$(C_1$-$C_4)$dialkylcarbamoyl$(C_1$-$C_4)$alkyl" "mono- or di-$(C_1$-$C_4)$alkylamino$(C_1$-$C_4)$alkyl", "amino$(C_1$-$C_4)$alkylcarbonyl" "diphenyl$(C_1$-$C_4)$alkyl", "phenyl$(C_1$-$C_4)$alkyl", "phenylcarboyl$(C_1$-$C_4)$alkyl" and "phenoxy$(C_1$-$C_4)$alkyl" are to be construed accordingly.

As used herein, the expression "cycloalkyl" includes all of the known cyclic groups. Representative examples of "cycloalkyl" includes without any limitation cyclopropyl, cyclobutyl, cyclopentyl, cyclohexyl, cycloheptyl, cyclooctyl, and the like. Derived expressions such as "cycloalkoxy", "cycloalkylalkyl", "cycloalkylaryl", "cycloalkylcarbonyl" are to be construed accordingly.

As used herein, the expression "$(C_2$-$C_6)$alkenyl" includes ethenyl and straight-chained or branched propenyl, butenyl, pentenyl and hexenyl groups. Similarly, the expression "$(C_2$-$C_6)$alkynyl" includes ethynyl and propynyl, and straight-chained or branched butynyl, pentynyl and hexynyl groups.

As used herein the expression "$(C_1$-$C_4)$acyl" shall have the same meaning as "$(C_1$-$C_4)$alkanoyl", which can also be represented structurally as "R—CO—," where R is a $(C_1$-$C_3)$alkyl as defined herein. Additionally, "$(C_1$-$C_3)$alkylcarbonyl" shall mean same as $(C_1$-$C_4)$acyl. Specifically, "$(C_1$-$C_4)$acyl" shall mean formyl, acetyl or ethanoyl, propanoyl, n-butanoyl, etc. Derived expressions such as "$(C_1$-$C_4)$acyloxy" and "$(C_1$-$C_4)$acyloxyalkyl" are to be construed accordingly.

As used herein, the expression "$(C_1$-$C_6)$perfluoroalkyl" means that all of the hydrogen atoms in said alkyl group are replaced with fluorine atoms. Illustrative examples include trifluoromethyl and pentafluoroethyl, and straight-chained or branched heptafluoropropyl, nonafluorobutyl, undecafluoropentyl and tridecafluorohexyl groups. Derived expression, "$(C_1$-$C_6)$perfluoroalkoxy", is to be construed accordingly. It should further be noted that certain of the alkyl groups as described herein, such as for example, "$(C_1$-$C_6)$alkyl" may partially be fluorinated, that is, only portions of the hydrogen atoms in said alkyl group are replaced with fluorine atoms and shall be construed accordingly.

As used herein, the expression "$(C_6$-$C_{10})$aryl" means substituted or unsubstituted phenyl or naphthyl. Specific examples of substituted phenyl or naphthyl include o-, p-, m-tolyl, 1,2-, 1,3-, 1,4-xylyl, 1-methylnaphthyl, 2-methylnaphthyl, etc. "Substituted phenyl" or "substituted naphthyl" also include any of the possible substituents as further defined herein or one known in the art. Derived expression, "$(C_6$-$C_{10})$arylsulfonyl," is to be construed accordingly.

As used herein, the expression "$(C_6$-$C_{10})$aryl$(C_1$-$C_4)$alkyl" means that the $(C_6$-$C_{10})$aryl as defined herein is further attached to $(C_1$-$C_4)$alkyl as defined herein. Representative examples include benzyl, phenylethyl, 2-phenylpropyl, 1-naphthylmethyl, 2-naphthylmethyl and the like.

As used herein, the expression "heteroaryl" includes all of the known heteroatom containing aromatic radicals. Representative 5-membered heteroaryl radicals include furanyl, thienyl or thiophenyl, pyrrolyl, isopyrrolyl, pyrazolyl, imidazolyl, oxazolyl, thiazolyl, isothiazolyl, and the like. Representative 6-membered heteroaryl radicals include pyridinyl, pyridazinyl, pyrimidinyl, pyrazinyl, triazinyl, and the like radicals. Representative examples of bicyclic heteroaryl radicals include, benzofuranyl, benzothiophenyl, indolyl, quinolinyl, isoquinolinyl, cinnolyl, benzimidazolyl, indazolyl, pyridofuranyl, pyridothienyl, and the like radicals.

As used herein, the expression "heterocycle" includes all of the known reduced heteroatom containing cyclic radicals. Representative 5-membered heterocycle radicals include tetrahydrofuranyl, tetrahydrothiophenyl, pyrrolidinyl, 2-thiazolinyl, tetrahydrothiazolyl, tetrahydrooxazolyl, and the like. Representative 6-membered heterocycle radicals include piperidinyl, piperazinyl, morpholinyl, thiomorpholinyl, and the like. Various other heterocycle radicals include, without limitation, aziridinyl, azepanyl, diazepanyl, diazabicyclo[2.2.1]hept-2-yl, and triazocanyl, and the like.

"Halogen" or "halo" means chloro, fluoro, bromo, and iodo.

In a broad sense, the term "substituted" is contemplated to include all permissible substituents of organic compounds. In a few of the specific embodiments as disclosed herein, the term "substituted" means substituted with one or more substituents independently selected from the group consisting of $C_{1-6}$alkyl, $C_{2-6}$alkenyl, $C_{1-6}$perfluoroalkyl, phenyl, hydroxy, —$CO_2H$, an ester, an amide, $C_1$-$C_6$alkoxy, $C_1$-$C_6$thioalkyl, $C_1$-$C_6$perfluoroalkoxy, —$NH_2$, Cl, Br, I, F, —NH-lower alkyl, and —N(lower alkyl)$_2$. However, any of the other suitable substituents known to one skilled in the art can also be used in these embodiments.

It should be noted that any atom with unsatisfied valences in the text, schemes, examples and tables herein is assumed to have the appropriate number of hydrogen atom(s) to satisfy such valences.

It will be understood that, as used herein, the phrase "microelectronic device" is inclusive of a "micro-optoelectronic device" and an "optoelectronic device". Thus, reference to microelectronic devices or a microelectronic device assemblies are inclusive of optoelectronic devices and micro-optoelectronic devices as well as assemblies thereof. Similarly, microelectromechanical systems (MEMS) include microoptoelectro-mechanical systems (MOEMS).

It will be understood that the term "redistribution layer (RDL)" refers to an electrical signal routing insulation material which features desirable and reliable properties. The term RDL may also be used interchangeably to describe buffer coating layers, such as for example, a stress relief or buffer layer between the solder ball and fragile low-K structure.

As used herein, the terms "polymer composition," "copolymer composition," "terpolymer composition" or "tetrapolymer composition" are used herein interchangeably and are meant to include at least one synthesized polymer, copolymer, terpolymer or tetrapolymer, as well as residues from initiators, solvents or other elements attendant to the synthesis of such polymers, where such residues are understood as not necessarily being covalently incorporated thereto. But some catalysts or initiators may sometimes be covalently bound to a part of the polymeric chain either at the beginning and/or end of the polymeric chain. Such residues and other elements considered as part of the "polymer" or "polymer composition" are typically mixed or co-mingled with the polymer such that they tend to remain therewith when it is transferred between vessels or between solvent or dispersion media. A polymer composition can also include materials added after synthesis of the polymer to provide or modify specific properties of such composition. Such materials include, but are not limited to solvent(s), antioxidant(s), photoinitiator(s), sensitizers and other materials as will be discussed more fully below.

As used herein, the term "modulus" is understood to mean the ratio of stress to strain and unless otherwise indicated, refers to the Young's Modulus or Tensile Modulus measured in the linear elastic region of the stress-strain curve. Modulus values are generally measured in accordance with ASTM method DI708-95. Films having a low modulus are understood to also have low internal stress.

The term "photodefinable" refers to the characteristic of a material or composition of materials, such as a polymer or polymer composition in accordance with embodiments of the present invention, to be formed into, in and of itself, a patterned layer or a structure. In alternate language, a "photodefinable layer" does not require the use of another material layer formed thereover, for example, a photoresist layer, to form the aforementioned patterned layer or structure. It will be further understood that a polymer composition having such a characteristic is generally employed in a pattern forming scheme to form a patterned film/layer or structure. It will be noted that such a scheme incorporates an "imagewise exposure" of the photodefinable material or layer formed therefrom. Such imagewise exposure being taken to mean an exposure to actinic radiation of selected portions of the layer, where non-selected portions are protected from such exposure to actinic radiation.

As used herein, the term "self-imageable compositions" will be understood to mean a material that is photodefinable and can thus provide patterned layers and/or structures after direct image-wise exposure of a film formed thereof followed by development of such images in the film using an appropriate developer.

It will be understood that the terms "dielectric" and "insulating" are used interchangeably herein. Thus reference to an insulating material or layer is inclusive of a dielectric material or layer and vice versa. Further, as used herein, the term "organic electronic device" will be understood to be inclusive of the term "organic semiconductor device" and the several specific implementations of such devices such as the organic field effect transistors (OFETs).

By the term, "a monomer repeat unit is derived" is meant that the polymeric repeating units are polymerized (formed) from, e.g., polycyclic norbornene-type monomers, wherein the resulting polymers are formed by 2,3 enchainment of norbornene-type monomers as shown below:

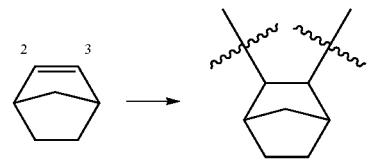

Accordingly, in accordance with the practice of this invention there is provided photoimageable solvent developable negative tone composition comprising:

a) a polymer having one or more repeating units of formula (IA) derived from a monomer of formula (I):

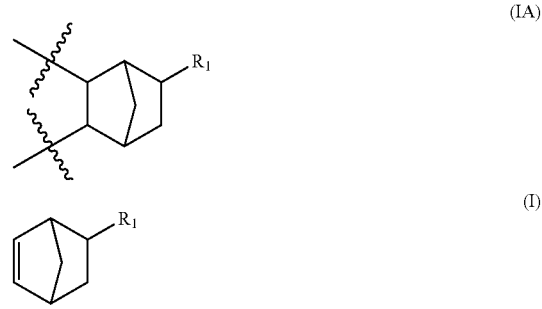

wherein ⁓ represents a position at which the bonding takes place with another repeat unit;

$R_1$ is $(C_6$-$C_{18})$alkyl, perfluoro$(C_1$-$C_{18})$alkyl, $(C_6$-$C_{10})$aryl $(C_1$-$C_6)$alkyl or —$(CH_2)_a$—$CO_2R_2$ where a is an integer from 0 to 4, and $R_2$ is hydrogen or $(C_1$-$C_4)$alkyl;

b) a compound of the formula (III):

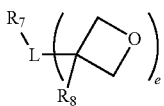

(III)

wherein e is an integer from 1 to 4;
L is a bond or a divalent linking or a spacer group selected from ether, ketone, amine, sulfide, sulfone, ester or an amide group;
$R_7$ is a core organic moiety selected from an aliphatic or an aromatic group;
$R_8$ is $(C_1-C_4)$alkyl;
c) a photoactive compound; and
d) a carrier solvent.

The polymers employed in the photoimageable compositions of this invention can be synthesized by any of the procedures known to one skilled in the art. Generally, such polymers are prepared either by vinyl addition polymerization and/or free radical polymerization. Typically, vinyl additional polymers are made using a transition metal catalyst, such as for example, palladium, nickel, platinum, and the like. See for example, U.S. Pat. Nos. 5,929,181; 6,455,650; 6,825,307; and 7,101,654; pertinent portions of which are incorporated herein by reference.

In one of the embodiments, the polymer of this invention further encompasses one or more additional repeat units represented by formula (IIA), said repeat unit is derived from a monomer of formula (II):

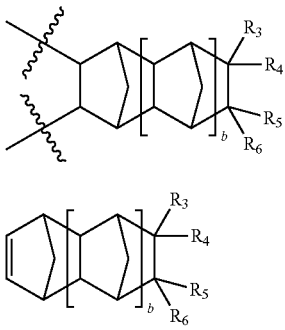

(IIA)

(II)

wherein:
⁓⁓⁓ denotes a place of bonding with another repeat unit;
b is 0 or 1;
$R_3$, $R_4$, $R_5$ and $R_6$ are the same or different and each independently of one another is selected from hydrogen, linear or branched $(C_1-C_{16})$alkyl, $(C_1-C_{16})$alkenyl, hydroxy $(C_1-C_{16})$alkyl, hydroxyperfluoro$(C_1-C_4)$alkyl$(C_1-C_4)$alkyl, perfluoro$(C_1-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_3)$alkyl, perfluoro$(C_6-C_{10})$aryl, perfluoro$(C_6-C_{10})$aryl$(C_1-C_3)$alkyl, di$(C_1-C_2)$alkylmaleimide$(C_3-C_6)$alkyl, di$(C_1-C_2)$alkylmaleimide$(C_2-C_6)$alkoxy$(C_1-C_2)$alkyl, hydroxy, $(C_1-C_{12})$alkoxy, $(C_3-C_{12})$cycloalkoxy, $(C_6-C_{12})$bicycloalkoxy, $(C_7-C_{14})$tricycloalkoxy, $(C1-C_{12})$alkoxy$(C_1-C_8)$alkyl, $(C_6-C_{10})$aryloxy$(C_1-C_3)$alkyl, $(C_5-C_{10})$heteroaryloxy$(C_1-C_3)$alkyl, $(C_6-C_{10})$aryloxy, $(C_5-C_{10})$heteroaryloxy, $(C_1-C_6)$acyloxy, $(C_1-C_6)$acyloxy, oxiranyl$(C_0-C_8)$alkyl, oxiranyl $(CH_2)_cO(CH_2)_d$—, halogen or a group of formula (A):

—$(CH_2)_c$—$(OCH_2-CH_2)_d$—OR  (A);

or a group of formula (B):

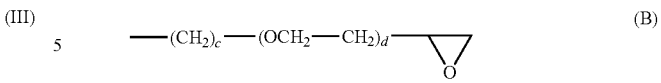

(B)

wherein:
c is an integer 0, 1, 2, 3 or 4;
d is an integer 0, 1, 2, 3 or 4; and
R is linear or branched $(C_1-C_6)$alkyl, $(C_5-C_8)$cycloalkyl, $(C_6-C_{10})$aryl or $(C_7-C_{12})$aralkyl; where each of the aforementioned substituents are optionally substituted with a group selected from halogen or hydroxy.

It should further be noted that any of the known monomers of formula (I) or (II) can be employed in this aspect of the invention. Representative examples of monomers of formula (I) or (II) include the following without any limitations:

bicyclo[2.2.1]hept-2-ene (NB);

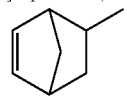

5-methylbicyclo[2.2.1]hept-2-ene (MeNB);

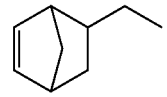

5-ethylbicyclo[2.2.1]hept-2-ene (EtNB);

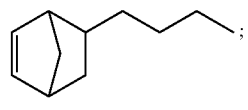

5-n-butylbicyclo[2.2.1]hept-2-ene (BuNB)

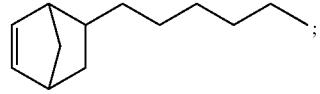

5-hexylbicyclo[2.2.1]hept-2-ene (HexNB)

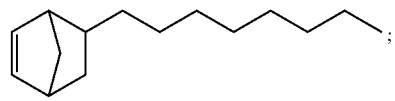

5-octylbicyclo[2.2.1]hept-2-ene (OctNB)

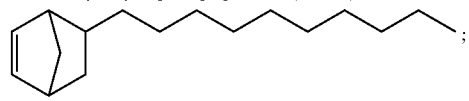

5-decylbicyclo[2.2.1]hept-2-ene (DecNB)

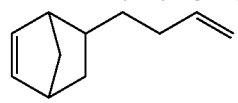

5-(but-3-en-1-yl)bicyclo[2.2.1]hept-2-ene (1-ButenylNB)

5-(but-2-en-1-yl)bicyclo[2.2.1]hept-2-ene (2-ButenylNB)

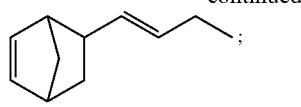

5-(but-1-en-1-yl)bicyclo[2.2.1]hept-2-ene (3-ButenylNB)

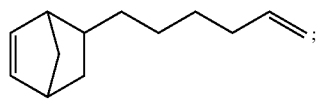

5-(hex-5-en-1-yl)bicyclo[2.2.1]hept-2-ene (HexenylNB)

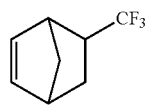

5-trifluoromethylbicyclo[2.2.1]hept-2-ene (CF$_3$NB);

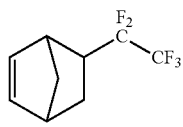

5-perfluoroethylbicyclo[2.2.1]hept-2-ene (C$_2$F$_5$NB);

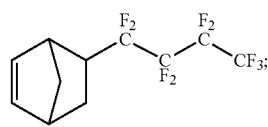

5-n-perfluorobutylbicyclo[2.2.1]hept-2-ene (C$_4$F$_9$NB)

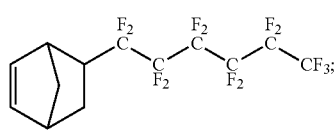

5-perfluorohexylbicyclo[2.2.1]hept-2-ene (C$_6$F$_{13}$NB)

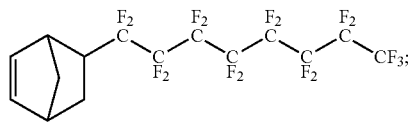

5-perfluorooctylbicyclo[2.2.1]hept-2-ene (C$_8$F$_{17}$NB)

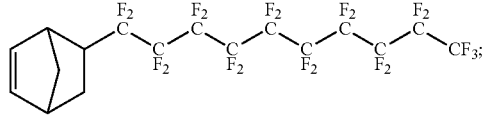

5-perfluorohexylbicyclo[2.2.1]hept-2-ene (C$_{10}$F$_{21}$NB)

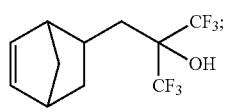

norbornenyl-2-trifluoromethyl-3,3,3-trifluoropropan-2-ol (HFANB)

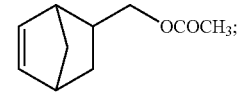

bicyclo[2.2.1]hept-5-en-2-ylmethyl acetate (MeOAcNB)

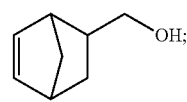

bicyclo[2.2.1]hept-5-en-2-ylmethyl (MeOHNB)

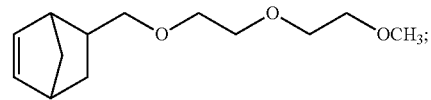

5-((2-(2-methoxyethoxy)ethoxy)methyl)bicyclo[2.2.1]hept-2-ene (NBTON)

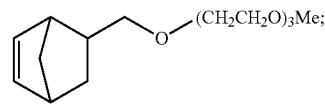

1-(bicyclo[2.2.1]hept-5-en-2-yl)-2,5,8,11-tetraoxadodecane (NBTODD)

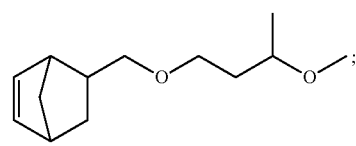

5-(3-methoxybutoxy)methyl-2-norbornene (NB-3-MBM)

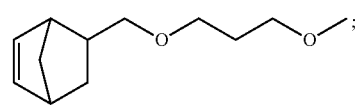

5-(3-methoxypropanoxy)methyl-2-norbornene (NB-3-MPM)

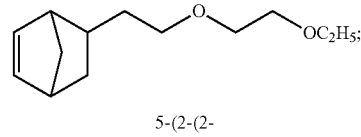

5-(2-(2-ethoxyethoxy)ethyl)bicyclo[2.2.1]hept-2-ene

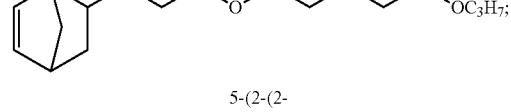

5-(2-(2-(2-propoxyethoxy)ethoxy)ethoxy)bicyclo[2.2.1]hept-2-ene

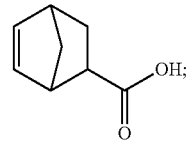

bicyclo[2.2.1]hept-5-ene-2-carboxylic acid (Acid NB)

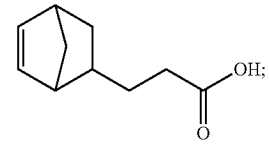

3-(bicyclo[2.2.1]hept-5-en-2-yl)propanoic acid (NBEtCOOH)

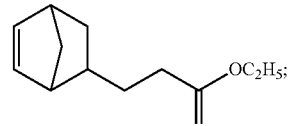

ethyl 3-(bicyclo[2.2.1]hept-5-en-2-yl)propanoate (EPEsNB)

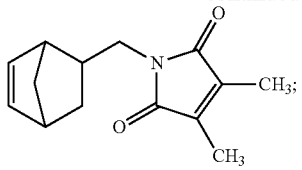

1-(bicyclo[2.2.1]hept-5-en-
2-ylmethyl)-3,4-dimethyl-1H-
pyrrole-2,5-dione (MeDMMINB)

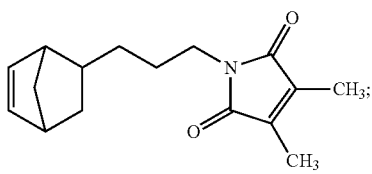

1-(3-(bicyclo[2.2.1]hept-5-en-
2-yl)propyl)-3,4-dimethyl-1H-
pyrrole-2,5-dione (PrDMMINB)

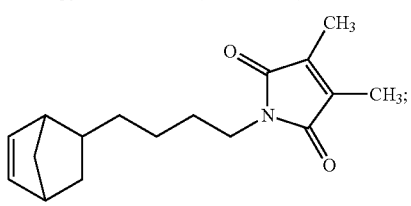

1-(4-(bicyclo[2.2.1]hept-
5-en-2-yl)butyl)-3,4-dimethyl-1H-
pyrrole-2,5-dione (BuDMMINB)

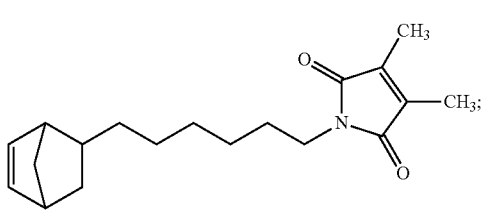

1-(6-(bicyclo[2.2.1]hept-
5-en-2-yl)hexyl)-3,4-dimethyl-1H-
pyrrole-2,5-dione (HexDMMINB)

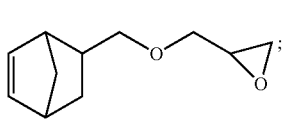 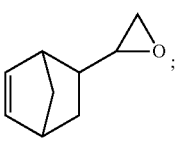

2-((bicyclo[2.2.1]hept-5-en-2-
ylmethoxy)methyl)oxirane
(MGENB)

2-
(bicyclo[2.2.1]hept-
5-en-2-yl)oxirane

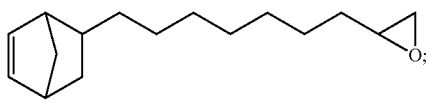

2-(7-(bicyclo[2.2.1]hept-5-en-2-yl)heptyl)oxirane

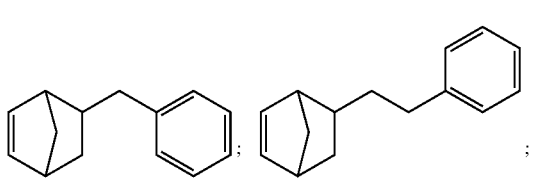

5-benzylbicyclo[2.2.1]hept-
2-ene (BenNB)

5-phenethylbicyclo[2.2.1]hept-
2-ene (PENB)

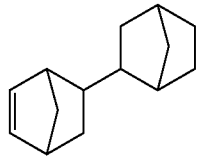

2-(bicyclo[2.2.1]hept-
5-en-2-
yl)bicyclo[2.2.1]heptane
(also referred
to herein as NBNBA)

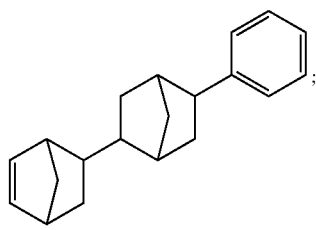

2-(bicyclo[2.2.1]hept-5-en-2-yl)-
phenyl-bicyclo[2.2.1]heptane
(also referred to herein as NBNBAPh)

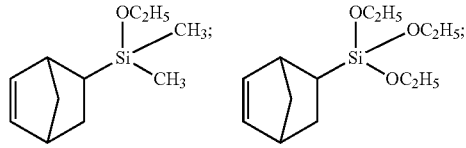

bicyclo[2.2.1]hept-5-en-2-
yl(ethoxy)dimethylsilane
(NBSiMe$_2$(OEt);

bicyclo[2.2.1]hept-5-en-2-
yl(triethoxy)silane
(TESNB)

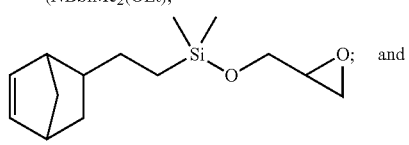

(2-(bicyclo[2.2.1]hept-5-en-2-
yl)ethyl)dimethyl(oxiran-2-
ylmethoxy)silane (NB-SiMe$_2$O-MGE)

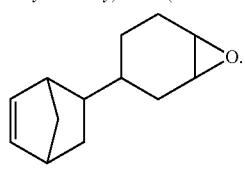

3-
(bicyclo[2.2.1]hept-5-en-2-yl)-
7-oxabicyclo[4.1.0]heptane
(NBCHEp)

Again, any of the polymerizable monomer as described herein can be used. Thus, in one of the embodiments the polymer of this invention encompasses one or more repeat units derived from the corresponding monomers selected from the group consisting of:

5-hexylbicyclo[2.2.1]hept-2-ene (HexNB);
5-octylbicyclo[2.2.1]hept-2-ene (OctNB);
5-decylbicyclo[2.2.1]hept-2-ene (DecNB);
5-perfluoroethylbicyclo[2.2.1]hept-2-ene ($C_2F_5$NB);
5-n-perfluorobutylbicyclo[2.2.1]hept-2-ene ($C_4F_9$NB);
5-perfluorohexylbicyclo[2.2.1]hept-2-ene ($C_6F_{13}$NB);
5-benzylbicyclo[2.2.1]hept-2-ene (BenNB);
5-phenethylbicyclo[2.2.1]hept-2-ene (PENB);
ethyl 3-(bicyclo[2.2.1]hept-2-en-2-yl)propanoate (EPEsNB), bicyclo[2.2.1]hept-5-ene-2-carboxylic acid (Acid NB) and norbornenylpropanoic acid (NBEtCOOH).

In yet another embodiment the polymer of this invention encompasses one or more repeat units derived from the corresponding monomers selected from the group consisting of:

5-(but-3-en-1-yl)bicyclo[2.2.1]hept-2-ene (1-ButenylNB);
5-(but-2-en-1-yl)bicyclo[2.2.1]hept-2-ene (2-ButenylNB);
5-(but-1-en-1-yl)bicyclo[2.2.1]hept-2-ene (3-ButenylNB);
norbornenyl-2-trifluoromethyl-3,3,3-trifluoropropan-2-ol (HFANB);
1-(3-(bicyclo[2.2.1]hept-5-en-2-yl)propyl)-3,4-dimethyl-1H-pyrrole-2,5-dione (PrDMM1NB);
1-(4-(bicyclo[2.2.1]hept-5-en-2-yl)butyl)-3,4-dimethyl-1H-pyrrole-2,5-dione (BuDMMINB);
1-(6-(bicyclo[2.2.1]hept-5-en-2-yl)hexyl)-3,4-dimethyl-1H-pyrrole-2,5-dione (HexDMMINB);
tetraoxadodecanenorbornene (NBTODD);
5-(3-methoxybutoxy)methyl-2-norbornene (NB-3-MBM);
5-(3-methoxypropanoxy)methyl-2-norbornene (NB-3-MPM);
5-((2-(2-methoxyethoxy)ethoxy)methyl)bicyclo[2.2.1]hept-2-ene (NBTON);
2-((bicyclo[2.2.1]hept-5-en-2-ylmethoxy)methyl)oxirane (MGENB);
2-(bicyclo[2.2.1]hept-5-en-2-yl)oxirane; and
2-(7-(bicyclo[2.2.1]hept-5-en-2-yl)heptyl)oxirane.

In a further embodiment, the composition of this invention encompasses a polymer which is a copolymer or a terpolymer containing at least one of the monomers of formula (I) and one or more monomers of formula (II).

Non-limiting examples of such copolymers or terpolymers include:

a copolymer containing repeating units derived from 5-decylbicyclo[2.2.1]hept-2-ene (DecNB) and 2-((bicyclo[2.2.1]hept-5-en-2-ylmethoxy)methyl)oxirane (MGENB); and a terpolymer containing repeating units derived from 5-decylbicyclo[2.2.1]hept-2-ene (DecNB), 5-phenethylbicyclo[2.2.1]hept-2-ene (PENB) and 2-((bicyclo[2.2.1]hept-5-en-2-ylmethoxy)methyl)oxirane (MGENB).

The polymers employed to form the compositions of this invention generally exhibit a number average molecular weight ($M_w$) of at least about 3,000. In another embodiment, the polymer employed in the composition of this invention has a $M_w$ of at least about 10,000. In yet another embodiment, the polymer employed in the composition of this invention has a $M_w$ of at least about 50,000. In some other embodiments, the polymer of this invention has a $M_w$ of at least about 100,000. In some other embodiments, the polymer of this invention has a $M_w$ ranging from about 100,000 to 500,000. The weight average molecular weight ($M_w$) of the polymer can be determined by any of the known techniques, such as for example, by gel permeation chromatography (GPC) equipped with suitable detector and calibration standards, such as differential refractive index detector calibrated with narrow-distribution polystyrene standards.

In another embodiment the composition of this invention includes one or more of the oxetane compound of formula (III). Non-limiting examples of such oxetane compounds of formula (III) include the following:

a compound of formula (IIIA):

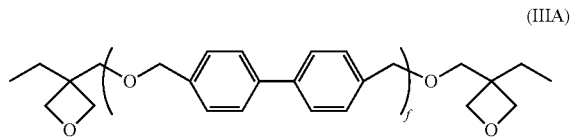

(IIIA)

wherein f is an integer from 1 to 3, thus when f=1, the compound is 4,4'-bis(((3-ethyloxetan-3-yl)methoxy)methyl)-1,1'-biphenyl;

a compound of formula (IIIB):

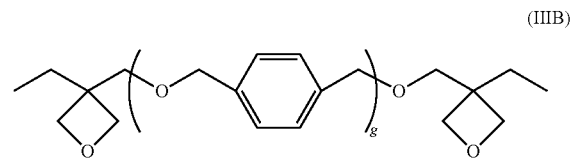

(IIIB)

wherein g is an integer from 1 to 3; commercially available under the trade name OXT-121, where g=1, the compound is referred to as (1,4-bis[(3-ethyl-3-oxetanylmethoxy)methyl]benzene);

a compound of formula (IIIC):

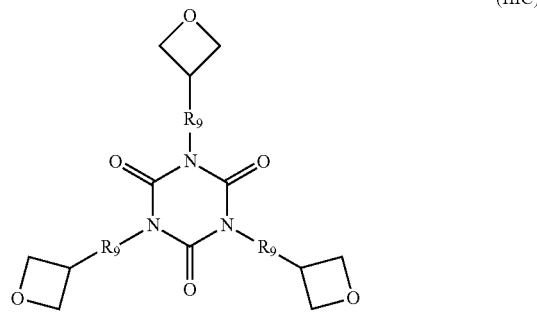

(IIIC)

wherein $R_9$ is a bond, $(C_1-C_{14})$alkyl or $(C_1-C_4)$alkoxy$(C_1-C_4)$alkyl;

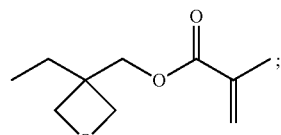

(3-ethyloxetan-3-yl)methyl methacrylate, commercially available as OXMA

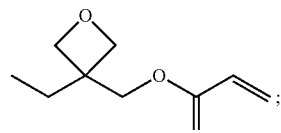

(3-ethyloxetan-3-yl)methyl acrylate

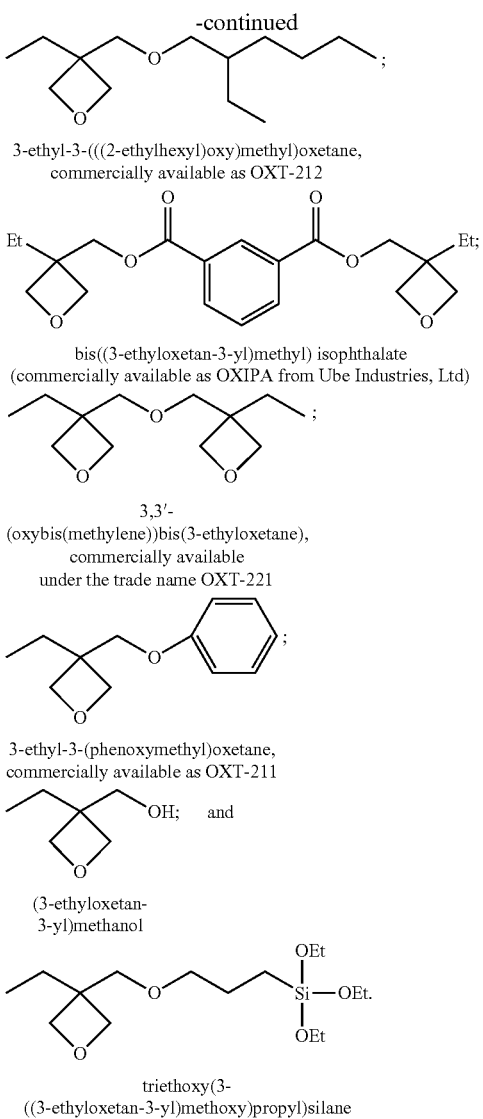

The compounds of formula (III) as disclosed herein are either known or themselves commercially available and/or can be readily synthesized by the procedures known in the art. For example, the compound of formula (IIIA) is available commercially as ETERNACOLL® OXBP from Ube Industries, Ltd. The compound of formula (IIIB) is available from Toa Gosei under the trade name OXT-121. The compound of formula (IIIC) is available from Double Bond Chemical, Taiwan, under the trade name DOUBLEMER® 4013N. (3-Ethyloxetan-3-yl)methyl acrylate is available commercially as OXE-10® from Osaka Organic Chemical Ind., Ltd.

Any of the solvents that can dissolve all of the components of the composition of this invention can be used as a carrier solvent. Representative examples of such solvents include alcohols, such as ethanol, isopropanol, butanols, and the like. Ketone solvents, such as acetone, methyl ethyl ketone (MEK), methyl amyl ketone (MAK), cyclohexanone, cyclopentanone, and the like. Hydrocarbon solvents, such as decane, toluene, p-menthane, and the like. Ester solvents, such as benzyl acetate, ethyl acetate, and the like. Glycol and ether solvents, such as diethylene glycol dimethyl ether, propylene glycol monomethyl ether (PGME), propylene glycol monomethyl ether acetate (PGMEA), and the like. Various other solvents, such as N-methyl-2-pyrrolidone (NMP), gamma-butyrolactone (GBL), N,N-dimethylacetamide, N,N-dimethylformamide (DMF), anisole, methyl 3-methoxypropionate, tetrahydrofuran (THF), 3-ethoxy-1,1,1,2,3,4,4,5,5,6,6,6-dodecafluoro-2-(trifluoromethyl)hexane (HFE-7500), 1,1,1,2,2,3,3,4,4-nonafluoro-4-methoxybutane, 1,1,1,2,2,3,4,4,4-nonafluoro-3-methoxybutane and mixtures in any combination thereof.

As noted, the photoimageable composition of this invention also includes a photoactive compound (PAC). Generally, any of the PAC that brings about the desirable result while exposed to a radiation can be used in this invention. More specifically, the PACs which are suitable in this invention include broadly two classes of compounds which are known in the literature as "photoacid generators" (PAGs) or "photobase generators" (PBGs). The PAGs when exposed to suitable radiation forms an acid which initiates the cross-linking of the oxetane compounds of this invention with the polymers employed.

Any of the PAGs known to one skilled in the art which would bring about the above noted results can be employed in this invention. Broadly speaking, the PAG that can be employed in this invention is a nucleophilic halogenides (e.g., diphenyliodonium salt, diphenylfluoronium salt) and complex metal halide anions (e.g., triphenylsulfonium salts). Exemplary PAGs without any limitation include, (p-isopropylphenyl)(p-methylphenyl)-iodonium tetrakis(pentafluorophenyl) borate (DPI-TPFPB), available commercially under the trade name RHODORSIL™ Photoinitiator 2074 from Rhodia, Inc.; (2-(4-methoxynaphthalen-1-yl)-2-oxoethyl)dimethylsulfonium tetrakis(perfluorophenyl)borate (MNDS-TPFPB), available commercially under the trade name TAG 382 from Toyo Inc; tris(4-tert-butyl)phenyl)sulfonium tetrakis-(pentafluorophenyl)borate (TTBPS-TPFPB); tris(4-tert-butyl)phenyl)sulfonium hexafluorophosphate (TTBPS-HFP); triphenylsulfonium triflate (TPS-Tf); triazine (TAZ-101); triphenylsulfonium hexafluoroantimonate (TPS-103); triphenylsulfonium bis(perfluoromethanesulfonyl) imide (TPS-N1); di-(p-t-butyl) phenyliodonium bis(perfluoromethanesulfonyl) imide (DTBPI-N1); tris(perfluoromethanesulfonyl) methide (TPS-C1); di-(p-t-butylphenyl)iodonium tris(perfluoromethanesulfonyl)methide (DTBPI-C1); diphenyliodonium hexafluorophosphate, diphenyliodonium hexafluorostibate, bis(4-(tert-butyl)phenyl)iodonium hexafluorophosphate, bis(4-(tert-butyl)phenyl)iodonium hexafluorostibate (DTB diphenyliodonium trifluoromethanesulfonate, diphenyliodonium 1,1,2,2,3,3,4,4,4-nonafluorobutane-1-sulfonate; bis(4-(tert-butyl)phenyl)iodonium trifluoromethanesulfonate; bis(4-(tert-butyl)phenyl)iodonium 1,1,2,2,3,3,4,4,4-nonafluorobutane-1-sulfonate; and combinations thereof.

In one of the embodiments of this invention the PAGs employed are the following:

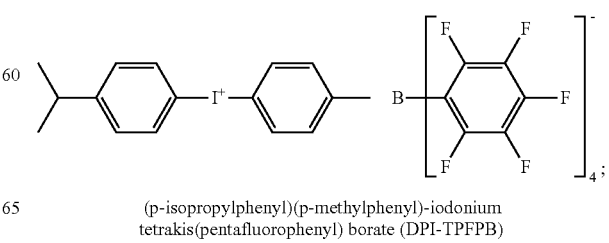

(p-isopropylphenyl)(p-methylphenyl)-iodonium
tetrakis(pentafluorophenyl) borate (DPI-TPFPB)

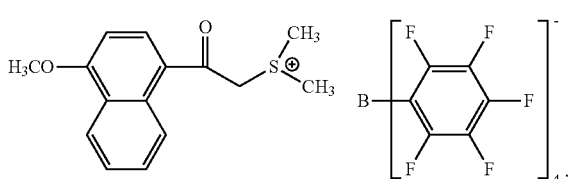

(2-(4-methoxynaphthalen-1-yl)-2-oxoethyl)dimethylsulfonium tetrakis(perfluorophenyl)borate (MNDS-TPFPB)

In addition, various other additives/components can be added to the composition of this invention, which is used for the formation of the photoimageable layer such that its mechanical and other properties can be tailored as desired. Also, other additives can be used to alter the processability, which include increase the stability of the polymer to thermal and/or light radiation. In this regard, the additives can include, but are not limited to, photosensitizers, antioxidants, adhesion promoters, and the like.

PAGs generally absorb actinic radiation over a broad range of wavelengths while in modern photoexposure tools, a limited range of wavelengths or even a single wavelength, is provided. Therefore, in addition to a PAG, a photosensitizer can be included within the polymer composition where such material is selected to be absorbing at a wavelength(s) used for the image-wise exposure. While any appropriate photosensitizer can be employed, a useful photosensitizer for exposure at wavelengths that include 248 nanometers includes CPTX of the formula:

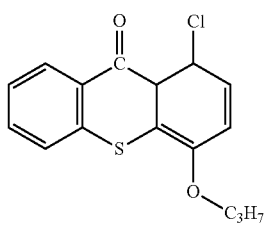

1-chloro-4-propoxy-1,9a-dihydro-9H-thioxanthen-9-one (CPTX).

As noted, the compositions of this invention are suitable as negative tone photoimageable compositions. Accordingly, a negative tome component can include compounds that generate a reactant that would cause the crosslinking in the polymer. Such negative tone component can include compounds, such as, but not limited to, a photosensitive free radical generator.

A negative tone photosensitive free radical generator is a compound which, when exposed to light breaks into two or more compounds, at least one of which is a free radical. In particular, the negative tone photoinitiator can include, but is not limited to, bis(2,4,6-trimethylbenzoyl)-phenylphosphineoxide (IRGACURE 819, Ciba Specialty Chemicals Inc.); 2-benzyl-2-dimethylamino-1-(4-morpholinophenyl)-butanone-1 (IRGACURE 369, Ciba); 2,2-dimethoxy-1,2-diphenylethan-1-one (IRGACURE 651, Ciba); 2-methyl-1 [4-(methylthio)-phenyl]-2-morpholinopropan-1-one (IRGACURE 907, Ciba); benzoin ethyl ether (BEE, Aldrich); 2-methyl-4'-(methylthio)-2-morpholino-propiophenone; 2,2'-dimethoxy-2-phenyl-acetophenone (IRGACURE 1300, Ciba); 2,6-bis(4-azidobenzylidene)-4-ethylcyclohexanone (BAC-E), and combinations thereof.

The photo-active compound, such as a PAG, can be present from about 0.5% to about 10% by weight of the polymer, generally represented as parts per hundred parts resin (pphr), i.e., 0.05 pphr to 10 pphr of PAG per 100 pphr of the polymer. In particular, the PAG can be present from about 1% to 3% by weight of the polymer (i.e., 1 to 3 pphr). Additionally, the ratio of PAG to photosensitizer is generally 2:1. It should be noted that the specific amount of PAG and photosensitizer used will of course be a function of the specific materials selected as well as other factors which include, among others, a desired photo-speed and film thickness.

The remaining percentage of the composition not accounted by the photoacid generator and the polymer (e.g., from about 50% to about 99%) can generally be made up with solvent, such as, but not limited to, MAK, mesitylene, N-methyl-2-pyrrolidinone, propylene carbonate, anisole, cyclohexanone, propyleneglycol monomethyl ether acetate, N-butyl acetate, diglyme, ethyl 3-ethoxypropionate, and combinations thereof.

As noted above, the photosensitive composition of this invention further encompasses one or more compounds having utility as, among other things, adhesion promoters, antioxidants, crosslinking, coupling or curing agent, and the like. Non-limiting examples of such compounds are selected from the group consisting of the following, commercially available materials are indicated by such commercial names.

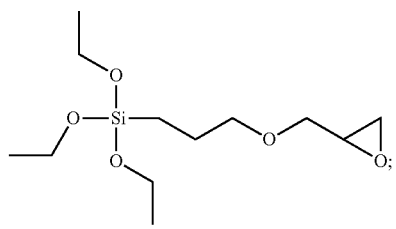

triethoxy(3-(oxiran-2-ylmethoxy)propyl)silane, also commonly known as 3-glycidoxypropyl triethoxysilane (3-GTS or KBE-403 from Shin-Etsu Chemical Co., Ltd.))

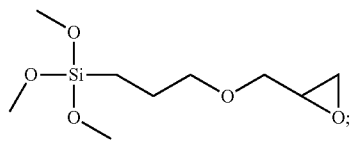

trimethoxy(3-(oxiran-2-ylmethoxy)propyl) silane, also commonly known as 3-glycidoxypropyl trimethoxysilane (KBE-403 from Shin-Etsu Chemical Co., Ltd.))

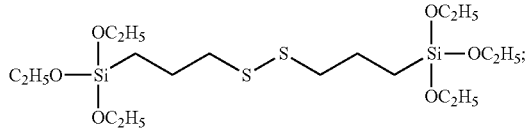

((triethoxysilyl)propyl)disulfide (Si-75 or Si-266 from Evonik)

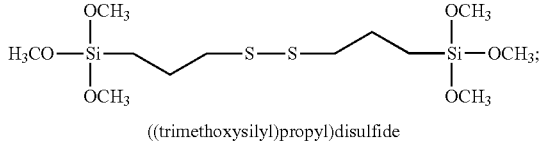

((trimethoxysilyl)propyl)disulfide

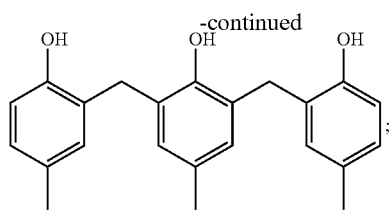

2,2'-((2-hydroxy-5-methyl-1,3-phenylene)
bis(methylene))bis(4-methylphenol)
(Antioxidant 80 from TCI Japan)

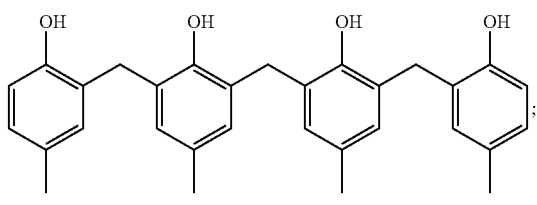

6,6'-methylenebis(2-(2-hydroxy-5-methylbenzyl)-4-
methylphenol) (4-PC)

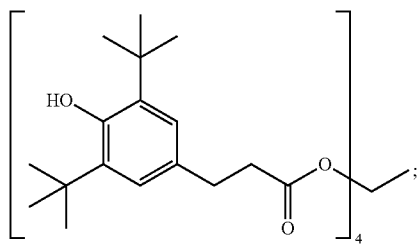

pentaerythritol tetrakis(3-(3,5-di-tert-butyl-4-
hydroxyphenyl)propionate) (Irganox 1010
from BASF)

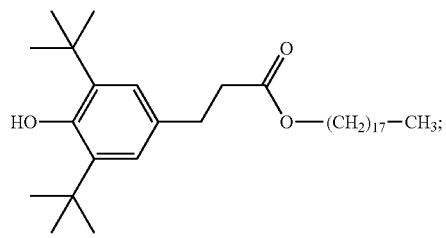

3,5-bis(1,1-dimethylethyl)-4-hydroxy-octadecyl
ester benzenepropanoic acid (Irganox 1076 from BASF)

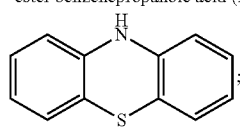

10H-phenothiazine
(Phenothiazine from Kanto)

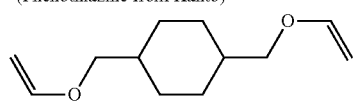

1,4-bis[(ethenyloxy)methyl]-
cyclohexane (Cyclohexane Divinyl
ether (CHDVE))

In another aspect of this invention there is also provided a photoimageable solvent developable negative tone composition comprising:

a) a polymer having a repeat unit of formula (IVA) derived from a monomer of formula (IV):

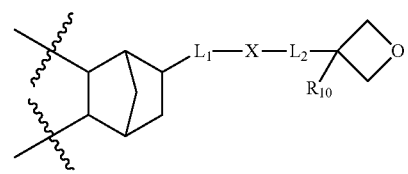

(IVA)

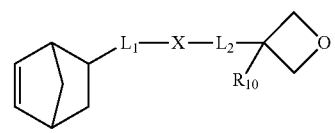

(IV)

wherein ∿∿∿ represents a position at which the bonding takes place with another repeat unit;

$L_1$ and $L_2$ are the same or different and each independently of one another is selected from a bond or a divalent alkylene or arylene group;

X is selected from:
—O—, —S—, —CO—, —$NR_{11}$—, —COO— or —OCO—, —$CONR_{11}$— or —$NR_{11}CO$—, —$SiR_{12}R_{13}O$—, —$SO_2$—, —$OSO_2$— or —$SO_2O$—,
where $R_{11}$, $R_{12}$ and $R_{13}$ are the same or different and each independently of one another is ($C_1$-$C_4$)alkyl;

$R_{10}$ is ($C_1$-$C_4$)alkyl;

b) a photoactive compound; and c) a carrier solvent.

In this aspect of the invention the polymer of this composition further encompasses one or more additional repeat units represented by formula (IIA), said repeat unit is derived from a monomer of formula (II) as described hereinabove.

The polymer in this aspect of the invention contains one or more of the repeat units derived from the respective monomers as defined herein. Non-limiting examples of such monomers may be enumerated as follows:

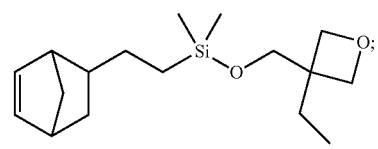

(2-(bicyclo[2.2.1]hept-5-en-2-yl)ethyl)
((3-ethyloxetan-3-yl)methoxy)dimethylsilane
(NB-SiMe₂O-Oxetane)

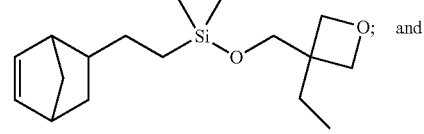

and (2-(bicyclo[2.2.1]hept-5-en-2-yl)ethyl)
((3-ethyloxetan-3-yl)methoxy)diethylsilane
(NB-SiEt₂O-Oxetane)

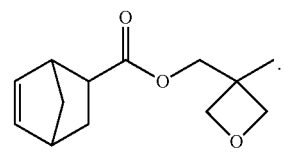

(3-methyloxetan-3-yl)methyl
bicyclo[2.2.1]hept-5-ene-2-
carboxylate(NB-Ester-Oxetane)

In another embodiment of this invention the polymer in this aspect of the invention encompasses one or more of the monomers of formula (I) or (II) as described herein.

Accordingly, non-limiting examples of the polymers in this aspect of the invention may be enumerated as follows:

a copolymer of (2-(bicyclo[2.2.1]hept-5-en-2-yl)ethyl) ((3-ethyloxetan-3-yl)methoxy)dimethylsilane and 5-decylbicyclo[2.2.1]hept-2-ene; and a copolymer of (3-methyloxetan-3-yl)methyl bicyclo [2.2.1]hept-5-ene-2-carboxylate and 5-decylbicyclo[2.2.1] hept-2-ene.

In addition, any of the PACs as described herein can be employed in this aspect of the invention. That is, any of the PAGs can be employed as described herein. Furthermore, in this aspect of the invention the composition further encompasses one or more additives, such as for example, photosensitizers, antioxidants and/or adhesion promoters as described herein.

In another aspect of this invention there is further provided a method of forming a film for the fabrication of a microelectronic or optoelectronic device comprising:

coating a suitable substrate with a composition according to this invention to form a film;

patterning the film with a mask by exposing to a suitable radiation;

developing the film after exposure to form a photopattern; and curing the film by heating to a suitable temperature.

The coating of the desired substrate to form a film with photosensitive composition of this invention can be performed by any of the coating procedures as described herein and/or known to one skilled in the art, such as by spin coating. Other suitable coating methods include without any limitation spraying, doctor blading, meniscus coating, ink jet coating and slot coating. Suitable substrate includes any appropriate substrate as is, or may be used for electrical, electronic or optoelectronic devices, for example, a semiconductor substrate, a ceramic substrate, a glass substrate.

Next, the coated substrate is first softbaked before the curing, i.e., heated to facilitate the removal of residual casting solvent, for example to a temperature from 60° C. to 120° C. for from about 1 to 30 minutes, although other appropriate temperatures and times can be used. In some embodiments the substrate is first softbaked before the curing at a temperature of from about 70° C. to about 100° C. for 2 minutes to 10 minutes. After the heating, the film is generally imagewise exposed to an appropriate wavelength of actinic radiation, wavelength is generally selected based on the choice of the photoactive compound employed in the polymer composition as described hereinabove. However, generally such appropriate wavelength is that produced by a mercury vapor lamp which is from 200 to 450 nm depending upon the type of mercury vapor lamp employed. It will be understood that the phrase "imagewise exposure" means exposing through a masking element to provide for a resulting pattern of exposed and unexposed portion of the film.

After an imagewise exposure of the film formed from the composition in accordance with the present invention, a development process is employed. As noted above, the compositions of this invention function primarily as "negative tone" compositions, that is, the development process removes only unexposed portions of the film thus leaving a negative image of the masking layer in the film.

Suitable developers can include any of the solvents referred to hereinabove as carrier solvents to make the compositions of this invention. A non-limiting example of a suitable developing solvent is a ketone solvent, such as for example MEK or MAK.

Thus some embodiments of the present invention provide self-imageable films that after imagewise exposure, a resulting image is developed using an organic solvent. After the image is developed, the substrate is rinsed to remove excess developer solvent, typical rinse agents are water or appropriate alcohols and mixtures thereof.

Accordingly, in some embodiments the developer employed is an organic solvent which is selected from the group consisting of MEK, MAK, decane, p-menthane, 3-ethoxy-1,1,1,2,3,4,4,5,5,6,6,6-dodecafluoro-2-(trifluoromethyl)hexane (HFE-7500), and mixtures in any combination thereof.

After the aforementioned rinsing, the substrate is dried and the imaged film finally cured. That is to say, the image is fixed. Such reaction is generally a further cross-linking reaction that can be initiated by heating and/or non-imagewise blanket exposure of the remaining material. Such exposure and heating can be in separate steps or combined as is found appropriate for the specific use of the imaged film. The blanket exposure is generally performed using the same energy source as employed in the imagewise exposure although any appropriate energy source can be employed. The heating is generally carried out at a desirable temperature, for example, from above 110° C. for a time of from several minutes to one or more hours. Where the remaining layer has been exposed during the imagewise exposure, image fixing is generally accomplished by a heating step to be tailored to complete any reaction initiated by the exposure. However an additional blanket exposure and heating, as discussed above, can also be employed. It should be realized, however, that the choice of a final cure process is also a function of the type of device being formed; thus a final fixing of the image may not be a final cure where the remaining layer is to be used as an adhesive layer or structure.

Accordingly, in some embodiments the resulting imagewise film or layer is cured by heating the patterned and developed substrate at a temperature of from about 120° C. to about 250° C. for about 20 minutes to about 240 minutes. In some other embodiments such curing is carried out at a temperature of from about 130° C. to about 200° C. for about 30 minutes to about 180 minutes. In yet some other embodiments such curing is carried out at a temperature of from about 150° C. to about 180° C. for about 60 minutes to about 120 minutes. Finally, in some other embodiments of this invention, the curing is performed at a temperature of from about 130° C. to about 200° C. at an incremental heating ramp of about 5° C./minute and for about 1 to 3 hours.

The devices are produced by using embodiments of the photosensitive resin composition of the present invention to form layers which are characterized as having improved mechanical properties, high heat resistance, an appropriate water absorption rate, high transparency, and low permittivity. In addition, such layers generally have an advantageous coefficient of elasticity after curing.

As previously mentioned, exemplary applications for embodiments of the photosensitive compositions in accordance with the present invention include redistribution layer, die attach adhesive, wafer bonding adhesive, insulation films (interlayer dielectric layers), protecting films (passivation layers), mechanical buffer films (stress buffer layers) or flattening films for a variety of semiconductor devices, including printed wiring boards. Specific applications of such embodiments encompass a die-attach adhesive to form a single or multilayer semiconductor device, dielectric film which is formed on a semiconductor device; a buffer coat film which is formed on the passivation film; an interlayer insulation film which is formed over a circuit formed on a semiconductor device.

Advantageously, it has now been found that the photosensitive compositions of this invention may be useful to form adhesive layers for bonding the semiconductor chips to each other, such as in chip-stack applications. For example, a redistribution layer used for such a purpose is composed of a cured product of the photosensitive adhesive composition of the present invention. Surprisingly, it has now been found that although the adhesive layer is a single-layer structure, it not only exhibits sufficient adhesiveness to the substrate but also is free of significant stress resulting due to the curing step. Accordingly, it may now be possible to avoid undesirably thick layer of film encompassing the chip as a laminate. It has been further observed that the laminates formed in accordance with the present invention are reliable in that the relaxation of stress concentration between layers caused by thermal expansion difference or the like can be obtained. As a result, the semiconductor device having low height and high reliability can be obtained. That is, devices with low aspect ratio and low thickness can be obtained. Such semiconductor device becomes particularly advantageous to electronic equipment, which has very small internal volume and is in use while carrying as a mobile device, for example. Even more advantageously, by practice of this invention it may now be possible to form a variety of electronic devices featuring hitherto unachievable level of miniaturization, thinning and light-weight, and the function of the semiconductor device is not easily damaged even if such devices are subject to rugged operations such as swinging or dropping.

Accordingly, in some of the embodiments of this invention there is also provided a cured product obtained by curing the photosensitive composition as described herein. In another embodiment there is also provided an optoelectronic or microelectronic device comprising the cured product of this invention as described herein.

The following examples are detailed descriptions of methods of preparation and use of certain compounds/monomers, polymers and compositions of the present invention. The detailed preparations fall within the scope of, and serve to exemplify, the more generally described methods of preparation set forth above. The examples are presented for illustrative purposes only, and are not intended as a restriction on the scope of the invention. As used in the examples and throughout the specification the ratio of monomer to catalyst is based on a mole to mole basis.

EXAMPLES

The following abbreviations have been used hereinbefore and hereafter in describing some of the compounds, instruments and/or methods employed to illustrate certain of the embodiments of this invention:
DecNB—5-decylbicyclo[2.2.1]hept-2-ene; PENB—5-phenethylbicyclo[2.2.1]hept-2-ene; MGENB—2-((bicyclo[2.2.1]hept-5-en-2-ylmethoxy)methyl)oxirane; NB-SiMe$_2$O-Oxetane-(2-(bicyclo[2.2.1]hept-5-en-2-yl)ethyl)((3-ethyloxetan-3-yl)methoxy)dimethylsilane; NB-Ester-Oxetane—(3-methyloxetan-3-yl)methyl bicyclo[2.2.1]hept-5-ene-2-carboxylate; NB-SiMe$_2$O-MGE—(2-(bicyclo[2.2.1]hept-5-en-2-yl)ethyl)dimethyl(oxiran-2-ylmethoxy)silane; NBCHEp—3-(bicyclo[2.2.1]hept-5-en-2-yl)-7-oxabicyclo[4.1.0]heptane; RHODORSIL 2074P—(p-isopropylphenyl)(p-methylphenyl)-iodonium tetrakis (pentafluorophenyl) borate (DPI-TPFPB); CPTX—1-chloro-4-propoxy-1,9a-dihydro-9H-thioxanthen-9-one; IRGANOX 1076—3,5-bis(1,1-dimethylethyl)-4-hydroxy-octadecyl ester benzenepropanoic acid; Si-75—((triethoxysilyl)propyl)disulfide; 3-GTS—triethoxy(3-(oxiran-2-yl)methoxy)propyl)silane, also commonly known as 3-glycidoxypropyl triethoxysilane; OXBP—4,4'-bis(((3-ethyloxetan-3-yl)methoxy)methyl)-1,1'-biphenyl and its oligomeric mixtures; OXIPA—bis((3-ethyloxetan-3-yl)methyl)isophthalate; OXMA—(3-ethyloxetan-3-yl)methyl methacrylate; OXT-121—(1,4-bis[(3-ethyl-3-oxetanylmethoxy)methyl]benzene); OXT-212—(3-ethyl-3[(2-ethylhexyloxy)methyl]oxetane); OXT-211—3-ethyl-3-(phenoxymethyl)oxetane; EBP—4,4'-bi(1,2-epoxycyclohexenyl); CHDVE—cyclohexane divinyl ether; CH—cyclohexane; EA—ethyl acetate; MAK—methyl amyl ketone; R.T.—room temperature; LC-MS: liquid chromatography-mass spectroscopy; GPC: gel permeation chromatography; $M_w$—weight average molecular weight; PDI—polydispersity index; phr: parts per hundred parts of resin.

The following examples describe the procedures used for the preparation of various polymers as disclosed herein in the preparation of the compositions of this invention. However, it should be noted that these examples are intended to illustrate the disclosure without limiting the scope thereof.

Example 1

Copolymer of DecNB/NB-SiMe$_2$O-Oxetane (70/30 molar ratio)

A 500 ml septum bottle was dried at 120° C. overnight and cooled with nitrogen to minimize air and water contamination, and then was charged with a mixture of cyclohexane (97 g) and ethyl acetate (97 g). DecNB (16.4 g) and NB-SiMe$_2$O-Oxetane (8.8 g) were then added to the septum bottle. The reaction mixture was purged with nitrogen for 30 minutes while stirring on top of a Thermix stirrer using a medium size stir bar. In a separate 20 ml septum bottle, catalyst solution was prepared (monomer/Ni catalyst=63/1) in a dry box by adding toluene (8 ml) to ($\eta^6$-toluene)Ni (C$_6$F$_5$)$_2$ (0.77 g). The catalyst solution was stirred with medium speed for 5 minutes. The catalyst solution was then injected into the reaction mixture using a 20 cc syringe. The reaction was run at 21° C. for 5 hours under nitrogen blanket.

After which time the reaction mixture was worked up as follows. In a separate 200 cc glass beaker, 19.2 g acetic acid (mole ratio acetic acid/catalyst=200/1) was premixed with 50 g deionized water and 10.9 g of hydrogen peroxide (mole ratio CH$_3$COOH/H$_2$O$_2$=1/1). The polymer solution in the 500 ml septum bottle was transferred into the 1000 cc beaker and then stirred at 21° C. for 24 hours. The per-acid treatment mixture was transferred to a 1000 cc Teflon separatory funnel to separate the polymer-solvent mixture from water. After the bottom water phase was drained, 50 cc of cyclohexane and 250 cc deionized water were added to the polymer-solvent mixture. The funnel was hand mixed for 3 minutes, then idled for 30 minutes until water phase was separated. The water wash was repeated at least 5 times until the pH value of drained water was about 6. The polymer was precipitated in 2 liter methanol, filtered and dried in a vacuum oven at 70° C. for 24 hours. The yield of the polymer was 62% and the polymer was characterized by GPC: $M_w$=42,600, PDI=1.7.

Examples 2-5

Copolymer of DecNB/NB-SiMe₂O-Oxetane (70/30 Molar Ratio)

The procedure of Example 1 was substantially repeated in Examples 2 to 6 except that the monomer to catalyst ratio was slightly changed to form the respective copolymers of DecNB/NB-SiMe₂O-Oxetane. The monomer/catalyst ratio employed in each of these Examples 2 to 6 along with the polymer yield and the GPC data are summarized in Table 1.

TABLE 1

| Example No. | Monomer/Ni Catalyst | Rxn Temp/ Rxn Time | $M_w$ | PDI | Yield |
|---|---|---|---|---|---|
| Example 2 | 100:1 | 21° C./20 hours | 61,600 | 1.7 | 83% |
| Example 3 | 126:1 | 21° C./20 hours | 74,700 | 1.8 | 86% |
| Example 4 | 126:1 | 21° C./20 hours | 69,800 | 1.8 | 85% |
| Example 5 | 300:1 | 21° C./20 hours | 96,100 | 1.6 | 68% |

Examples 6-7

Copolymer of DecNB/NB-Ester-Oxetane (70/30 Molar Ratio)

The procedure of Example 1 was substantially repeated in Examples 6 and 7 except that the monomers used were DecNB and NB-Ester-Oxetane and the monomer to catalyst ratio used was 100:1; toluene was used as the solvent in Example 6 and 50/50 (weight) mixture of CH and EA were used as the solvent mixture in Example 7. The polymerization was carried out at a temperature of 21° C. for 20 hours in both Examples 6 and 7. The polymer yield and the GPC data are summarized in Table 2.

TABLE 2

| Example No. | $M_w$ | PDI | Yield |
|---|---|---|---|
| Example 6 | 78,200 | 1.7 | 90% |
| Example 7 | 69,100 | 1.9 | 66% |

Example 8A-8B

Terpolymers of DecNB/PENB/NB-oxetane

The procedure of Example 1 was substantially repeated in Examples 8A and 8B except that the three monomers were used to form the terpolymer, specific monomers and its molar ratios and the monomer to catalyst ratio are summarized in Table 2A. The polymerization was carried out at a temperature of 21° C. for 20 hours in both Examples 8A and 8B. The polymer yield and the GPC data are also summarized in Table 2A.

TABLE 2A

| Example No. | Terpolymer Composition | Monomer/Ni Catalyst | $M_w$ | PDI | Yield |
|---|---|---|---|---|---|
| Example 8A | 50/25/25 DecNB/PENB/NB-SiMe₂O-oxetane | 150:1 | 77,600 | 1.7 | 80% |
| Example 8B | 30/40/30 DecNB/PENB/NB-Ester-oxetane | 90:1 | 72,300 | 1.8 | 76% |

Photoimageable Polymer Composition and Imaging Studies

The following Examples illustrate the photocrosslinking and imageability of the oxetane compounds as well as the oxetane functionalized polymers of this invention with a variety of other components as described herein.

Example 9

Composition and Imaging of Oxetane Functionalized Polymers

A negative tone I-line photodefinable formulation was prepared in a 125 ml brown glass bottle by dissolving the polymer obtained in Example 5, 70/30 DecNB/NB-SiMe₂O-Oxetane copolymer (16 g) in MAK (24 g, 40% solid). To this solution was added CHDVE (0.8 g, 5 phr), Irganox 1076 (0.24 g, 1.5 phr), 3-GTS (0.8 g, 5 phr), Rhodorsil 2074P (0.32 g, 2 phr), CPTX (0.096 g, 0.6 phr) and phenothiazine (0.006 g, 0.039 phr). The formulation in brown bottle was then mixed on a roller overnight. The formulation was filtered through 1 micron pore PTFE disc filter under 40 psi pressure. The filtered polymer solution was collected in a brown glass bottle and the final formulation was stored at 21° C.

A negative tone I-line photodefinable thick film (~10 μm) was formed by spin-coating onto a 4-inch $SiO_2$ wafer by spinning at 500 rpm for 5 seconds and then at 1100 rpm for 30 seconds (1000 r/s ramp). The $SiO_2$ wafer was pretreated with $O_2$/Ar 50/50 reactive ion etch (RIE) at 300 W for 30 seconds. A soft-bake temperature of 110° C. for 240 seconds was used to remove solvent. The film was image-wise exposed with input energy density of 100 mJ/cm², 250 mJ/cm², 500 mJ/cm² and 1000 mJ/cm². A negative-tone glass photo mask was used. The film was subjected to post exposure bake (PEB) at 90° C. for 300 seconds. The film was developed in MAK developer. The pattern via hole opening was determined using optical microscope.

Examples 10-11

In each of Examples 10 and 11, the photoimageable compositions were prepared substantially in the same manner as described in Example 9 except that in Example 10, 3-GTS was not included and in Example both CHDVE and 3-GTS were not included.

The I-line sensitivity at various exposure dose and the resulting via resolution of the images are summarized in Table 3.

TABLE 3

| Composition | Example 9 | Example 10 | Example 11 |
|---|---|---|---|
| 3-GTS (phr) | 5 | | |
| CHDVE (phr) | 5 | 5 | |
| I-lin Sensitivity | Via Resolution | Via Resolution | Via Resolution |
| 100 mJ/cm² | 20 μm close | 20 μm open | 20 μm open |
| 250 mJ/cm² | 20 μm close | 20 μm open | 20 μm close |
| 500 mJ/cm² | 20 μm close | 20 μm open | 20 μm close |

Examples 12-13

Composition and Imaging of NB-Ester-Oxetane Polymers

The procedure as set forth in Example 9 was substantially repeated in Examples 12 and 13 to form a photoimageable composition except that a polymer obtained in Example 6, a 70:30 copolymer of DecNB/NB-Ester-Oxetane, was employed. The results are summarized in Table 4. The photospeed was slower than the composition of Example 9.

TABLE 4

| Composition | Example 12 | Example 13 |
|---|---|---|
| 3-GTS (phr) | 5 | 5 |
| CHDVE (phr) | 5 | 5 |
| PEB Temperature | 110° C./4 min | 120° C./4 min |
| I-line Sensitivity | Via Resolution | Via Resolution |
| 100 mJ/cm$^2$ | wash off | wash off |
| 250 mJ/cm$^2$ | 20 μm, side wash off | 20 μm, wash off |
| 500 mJ/cm$^2$ | 20 μm, side wash off | 20 μm open |
| 1000 mJ/cm$^2$ |  | 20 μm open |

PEB—post exposure bake

Examples 14-15

Composition and Imaging of Terpolymers

The procedure as set forth in Example 9 was substantially repeated in Examples 14 and 15 to form a photoimageable composition except that a polymers obtained in Examples 8A and 8B were respectively used in Examples 14 and 15. The results are summarized in Table 5.

TABLE 5

| Composition | Example 14 | Example 15 |
|---|---|---|
| Polymer | Example 8A | Example 8B |
| Rhodorsil 2074P (phr) | 2 | 2 |
| CPTX (phr) | 0.6 | 0.6 |
| Phenothiazine (phr) | 0.039 | 0.039 |
| 3-GTS (phr) |  | 5 |
| Irganox 1076 (phr) | 1.5 | 1.5 |
| CHDVE (phr) | 5 | 5 |
| I-line Sensitivity | Via Resolution | Via Resolution |
| 300 mJ/cm$^2$ | 20 μm open | 20 μm open |

Example 16

Effect of Cure Temperature on Reactive Group Conversion

The reactivity of the photoimageable compositions of this invention, i.e., the activity of the oxetane group was compared with the oxirane and cyclohexene epoxide functionality by thermal curing the film on the silicon oxide wafer. The spin coated films were cured at 120° C., 140° C. and 160° C. for 1 hour and the conversion was measured by ATR method. The results from the infrared (IR) analysis are summarized in Table 6, which showed that DecNBINB-SiMe$_2$O-Oxetane (polymers of Example 1-5) has a faster reactivity compared to DecNB/MGENB but slower than DecNBNBCHEp (Comparative Example 2).

TABLE 6

| Cure Temperature | 70/30 Dec/MGENB (M$_w$ = 72,000) 844 to 720 cm$^{-1}$ band Control | 70/30 Decyl/NB-SiMe$_2$-Oxetane (M$_w$ = 42,600) 981 to 720 cm$^{-1}$ band Example 1 | 70/30 Dec/NBCHEp (M$_w$ = 46,000) 794 to 720 cm$^{-1}$ band Comparative Example 2 |
|---|---|---|---|
| 120° C. 1 hour | 0.686 | 0.440 | 0.106 |
| 140° C. 1 hour | 0.515 | 0.318 | 0.010 |
| 160° C. 1 hour | 0.288 | 0.209 | 0.008 |
| Uncured polymer | 0.71 | 1.913 | 1.076 |

The following examples illustrate the formation of oxetane containing compositions of this invention which feature better tensile strength and modulus.

Examples 17-19

Compositions Containing Oxetanes

The procedure as set forth in Example 9 was substantially repeated in Examples 17 to 19 to form a photoimageable composition except for using various ingredients as summarized in Table 7.

TABLE 7

| Composition | Example 17 | Example 18 | Example 19 |
|---|---|---|---|
| Polymer (dissolved in MAK) | 30/40/30 terpolymer of DecNB/PENB/MGENB | 30/40/30 terpolymer of DecNB/PENB/MGENB | 30/40/30 terpolymer of DecNB/PENB/MGENB |
| Rhodorsil 2074P (phr) | 2 | 2 | 2 |
| CPTX (phr) | 0.6 | 0.6 | 0.6 |
| Phenothiazine (phr) | 0.137 | 0.137 | 0.137 |
| Irganox 1076 (phr) | 1.5 | 1.5 | 1.5 |
| 3-GTS (phr) | 5 |  |  |
| Si-75 (phr) |  | 5 | 5 |
| OXBP |  | 30 |  |
| OXIPA |  |  | 30 |

The compositions thus formed were then cast into 40 micron thick films for tensile test measurements. The films were cured at 200° C. for 60 minutes under nitrogen atmosphere. The results of the tensile measurements are summarized in Table 8. It is evident from the data presented in Table 8, the tensile modulus observed for both compositions containing the oxetane compound, namely Example 18 and Example 19, are much higher compared with the composition containing no oxetane compound, i.e., Example 17. It should further be noted that there is no detrimental effect on percent elongation at break for the oxetane containing compositions. Interestingly, the coefficient of thermal expansion (CTE in ppm/K) was observed to be low for the composition containing OXBP, Example 18, when compared with the other two compositions.

TABLE 8

| Example No. | TS (MPa) | TM (MPa) | % ETB | CTE (ppm/K) |
|---|---|---|---|---|
| Example 17 | 33.3 (±3.7) | 1550 (±23) | 8.7 (±5.3) | 134.8 (±10.8) |
| Example 18 | 42.2 (±3.1) | 1700 (±62) | 10.9 (±3.4) | 121.7 (±4.8) |
| Example 19 | 42.2 (±1.1) | 1980 (±38) | 7.2 (±3.6) | 154.6 (±3) |

TS—Tensile Strength;
TM—Tensile Modulus;
ETB—Elongation to Break;
CTE—Coefficient of Thermal Expansion

Examples 20-23

Compositions Containing Oxetanes

The procedure as set forth in Example 9 was substantially repeated in Examples 20 to 23 to form a photoimageable composition except for using various ingredients as summarized in Table 9. The polymer used in each of these examples was 30/40/30 terpolymer of DecNB/PENB/MGENB dissolved in MAK.

TABLE 9

| Composition | Example 20 | Example 21 | Example 22 | Example 23 |
|---|---|---|---|---|
| Rhodorsil 2074P (phr) | 2 | 2 | 2 | 2 |
| CPTX (phr) | 0.6 | 0.6 | 0.6 | 0.6 |
| Phenothiazine (phr) | 0.137 | 0.137 | 0.137 | 0.137 |
| 3-GTS (phr) | 5 | 5 | 5 | 5 |
| OXBP | | 30 | | |
| OXT-121 | | | 30 | 45 |

The compositions thus formed were then cast into 40 micron thick films for tensile test measurements. The films were cured at 200° C. for 60 minutes under nitrogen atmosphere. The results of the tensile measurements are summarized in Table 10. It is evident from the data presented in Table 10, the tensile modulus observed for compositions containing the oxetane compounds, namely Examples 21 to 23, are much higher compared with the composition containing no oxetane compound, i.e., Example 20. It should further be noted that there is no detrimental effect on percent elongation at break for the oxetane containing compositions.

TABLE 10

| Example No. | TS (MPa) | TM (MPa) | % ETB |
|---|---|---|---|
| Example 20 | 32.9 (±1.2) | 1490 (±56) | 13.3 (±3) |
| Example 21 | 44.2 (±2.4) | 1680 (±35) | 12.5 (±3.3) |
| Example 22 | 41.9 (±0.6) | 1570 (±80) | 10.8 (±1.3) |
| Example 23 | 47.2 (±1.3) | 1640 (±125) | 13.7 (±1.8) |

TS—Tensile Strength;
TM—Tensile Modulus;
ETB—Elongation to Break

Examples 24-29

Compositions Containing Oxetane Additives

The procedure as set forth in Example 9 was substantially repeated in Examples 24 to 29 to form a photoimageable composition except for using various ingredients as summarized in Table 11. The polymer used in each of these examples was 70/30 copolymer of DecNB/MGENB dissolved in MAK.

TABLE 11

| Composition | Ex. 24 | Ex. 25 | Ex. 26 | Ex. 27 | Ex. 28 | Ex. 29 |
|---|---|---|---|---|---|---|
| Rhodorsil 2074P (phr) | 2 | 2 | 2 | 2 | 2 | 2 |
| CPTX (phr) | 0.6 | 0.6 | 0.6 | 0.6 | 0.6 | 0.6 |
| Phenothiazine (phr) | 0.137 | 0.137 | 0.137 | 0.137 | 0.137 | 0.137 |
| Irganox 1076 (phr) | 1.5 | 1.5 | 1.5 | 1.5 | 1.5 | 1.5 |
| 3-GTS (phr) | 5 | 5 | 5 | 5 | 5 | 5 |
| OXT-212 | | 5 | 15 | | | |
| OXT-211 | | | | 5 | 15 | |
| OXMA | | | | | | 15 |

The compositions thus formed were then cast into 10 micron thick films for tensile test measurements. The films were cured at 200° C. for 60 minutes under nitrogen atmosphere. The results of the tensile measurements are summarized in Table 12. It is evident from the data presented in Table 12, all compositions, Examples 25 to 29, with oxetane compound exhibited higher percent elongation at break compared with Example 24, which contained no oxetane compound.

TABLE 12

| Example No. | TS (MPa) | TM (MPa) | % ETB |
|---|---|---|---|
| Example 24 | 17.3 (±1.9) | 579 (±52) | 17.7 (±3.4) |
| Example 25 | 17.2 (±3.7) | 554 (±80) | 24 (±3.7) |
| Example 26 | 13.5 (±4) | 494 (±87) | 17.1 (±3.9) |
| Example 27 | 16.4 (±3.1) | 633 (±51) | 27.3 (±1.4) |
| Example 28 | 16.2 (±3.7) | 593 (±18) | 24.2 (±4) |
| Example 29 | 15.6 (±1) | 609 (±27) | 23.6 (±4) |

TS—Tensile Strength;
TM—Tensile Modulus;
ETB—Elongation to Break

Examples 30-32

Compositions Containing Oxetane Additives

The procedure as set forth in Example 9 was substantially repeated in Examples 30 to 32 to form a photoimageable composition except for using various ingredients as summarized in Table 13. The polymer used in each of these examples was 30/40/30 terpolymer of DecNB/PENB/MGENB dissolved in MAK.

TABLE 13

| Composition | Example 30 | Example 31 | Example 32 |
|---|---|---|---|
| Rhodorsil 2074P (phr) | 2 | 2 | 2 |
| CPTX (phr) | 0.6 | 0.6 | 0.6 |
| Phenothiazine (phr) | 0.137 | 0.137 | 0.137 |
| Irganox 1076 (phr) | 1.5 | 1.5 | 1.5 |
| 3-GTS (phr) | 5 | | |
| Si-75 | | 5 | 5 |
| OXBP | | 30 | |
| OXIPA | | | 30 |

The compositions thus formed were then cast into 40 micron thick films for yellowness index (YI) measurements. The films were cured at 200° C. for 60 minutes under nitrogen atmosphere. The results of the YI measurements are summarized in Table 14. It is evident from the data presented in Table 14, the composition with OXIPA, Example 32, exhibited somewhat lower YI compared with the control, Example 30, which contained no oxetane compound, suggesting less decoloration with OXIPA composition than the OXBP composition, i.e., Example 31.

TABLE 14

| Example No. | YI 0 hrs | YI after 100 hrs at 150° C. | YI after 300 hrs at 150° C. | YI after 500 hrs at 150° C. |
|---|---|---|---|---|
| Example 30 | 14.9 | 23.4 | 45 | 60.5 |
| Example 31 | 17.5 | 50.7 | 64.6 | 86.8 |
| Example 32 | 22.7 | 28.9 | 37.3 | 43.9 |

YI—Yellowness index

Examples 33-34

Compositions Containing Oxetane Additives

The procedure as set forth in Example 9 was substantially repeated in Examples 33 to 34 to form a photoimageable composition except for using various ingredients as summarized in Table 15. The polymer used in each of these examples was 50/20/30 terpolymer of DecNB/PENB/MGENB dissolved in MAK.

TABLE 15

| Composition | Example 33 | Example 34 |
|---|---|---|
| Rhodorsil 2074P (phr) | 2 | 2 |
| CPTX (phr) | 0.6 | 0.6 |
| Phenothiazine (phr) | 0.137 | 0.137 |
| Irganox 1076 (phr) | 1.5 | 1.5 |
| 3-GTS (phr) | 5 | 5 |
| Si-75 | 5 | 5 |
| EBP | 30 | |
| OXIPA | | 30 |

The compositions thus formed were then cast into 40 micron thick films for yellowness index (YI) measurements. The films were cured at 200° C. for 60 minutes under nitrogen atmosphere. The results of the YI measurements are summarized in Table 16. It is evident from the data presented in Table 16, the YI of composition with OXIPA, Example 34, is lower compared with the EBP containing composition, Example 33. In addition, it was also observed that there is a significant improvement in the thermo-oxidative stability (TOS) of the composition of Example 34 with the addition of OXIPA.

TABLE 16

| Example No. | YI 0 hrs | YI after 100 hrs at 150° C. | YI after 300 hrs at 150° C. | YI after 500 hrs at 150° C. |
|---|---|---|---|---|
| Example 33 | 22.4 | 54.3 | 84.7 | Not measured |
| Example 34 | 21.7 | 28.9 | 37.9 | 44 |

YI—Yellowness index

Comparative Examples

The following Comparative Examples 1 and 2 are provided to show the oxetane compounds and/or the polymers containing such functional groups of this invention exhibit superior properties when compared with similar photocrosslinking agents reported in the literature. For example, Comparative Example 1 shows the use of siloxy-oxiranyl compound to affect the photocrosslinking effect whereas Comparative Example 2 uses cyclohexane epoxy compound, which are compared with the compositions of this invention.

Comparative Example 1

Copolymer of DecNB/NB-SiMe$_2$O-MGE (70/30 molar ratio)

The procedure of Example 1 was substantially repeated in Comparative Example 1 except that the monomers used were DecNB and NB-SiMe$_2$O-MGE; the monomer to catalyst ratio used was 100:1; 50/50 (wt/wt) toluene/ethyl acetate solvent mixture was used as the solvent. The polymerization was carried out at a temperature of 21° C. for 20 hours. The polymer yield was 88% and was characterized by GPC: $M_w$=145,500; PDI=2.8.

Comparative Example 2

Copolymer of DecNB/NBCHEp (70/30 Molar Ratio)

The procedure of Example 1 was substantially repeated in Comparative Example 2 except that the monomers used were DecNB and NBCHEp; the monomer to catalyst ratio used was 100:1; 50/50 (wt/wt) toluene/ethyl acetate solvent mixture was used as the solvent. The polymerization was carried out at a temperature of 21° C. for 20 hours. The polymer yield was 95% and was characterized by GPC: $M_w$=77,700; PDI=2.2.

Comparative Example 3

Composition and Imaging of DecNB/NB-SiMe$_2$O-MGE Polymers

The procedure as set forth in Example 9 was substantially repeated in Comparative Example 3 to form a photoimageable composition except that a polymer obtained in Comparative Example 1, a 70:30 copolymer of DecNB/NB-SiMe$_2$O-MGE, was employed. The results are summarized in Table 17. The photospeed was about similar to the composition of Example 9.

TABLE 17

| Composition | Comp. Example 3 |
|---|---|
| 3-GTS (phr) | 5 |
| CHDVE (phr) | 5 |
| I-line Sensitivity | Via Resolution |
| 100 mJ/cm$^2$ | 20 μm open |
| 250 mJ/cm$^2$ | 20 μm open |
| 500 mJ/cm$^2$ | 100 μm open |

Comparative Examples 4-7

Composition and Imaging of DecNB/NBCHEp Polymers

The procedure as set forth in Example 9 was substantially repeated in Comparative Examples 4 to 7 to form a photoimageable composition except that a polymer obtained in Comparative Example 2, a 70:30 copolymer of DecNB/NBCHEp, was employed. The results are summarized in Table 18. The photospeed was slower than the composition of Example 9.

TABLE 18

| Composition | Comp. Ex. 4 | Comp. Ex. 5 | Comp. Ex. 6 | Comp. Ex. 7 |
|---|---|---|---|---|
| 3-GTS (phr) | 5 | | 5 | |
| CHDVE (phr) | 5 | 5 | | |
| Spin Speed | 4000 rpm/ 30 s | 4000 rpm/ 30 s | 4000 rpm/ 30 s | 4000 rpm/s |
| I-line Sensitivity | Via Resolution | Via Resolution | Via Resolution | Via Resolution |
| 100 mJ/cm² | Wash off | Wash off | Wash off | |
| 250 mJ/cm² | 20 μm open | 20 μm open | Wash off | 20 μm open |
| 500 mJ/cm² | 20 μm open | 20 μm open | 20 μm open | 20 μm open |
| 1000 mJ/cm² | | | | 20 μm open |

Although the invention has been illustrated by certain of the preceding examples, it is not to be construed as being limited thereby; but rather, the invention encompasses the generic area as hereinbefore disclosed. Various modifications and embodiments can be made without departing from the spirit and scope thereof.

What is claimed is:

1. A photoimageable solvent developable negative tone composition comprising:
   a) a polymer selected from the group consisting of:
      a copolymer containing repeating units derived from 5-decylbicyclo[2.2.1]hept-2-ene (DecNB) and 2-((bicyclo[2.2.1]hept-5-en-2-ylmethoxy)methyl)oxirane (MGENB); and
      a terpolymer containing repeating units derived from 5-decylbicyclo[2.2.1]hept-2-ene (DecNB), 5-phenethylbicyclo[2.2.1]hept-2-ene (PENB) and 2-((bicycle[2.2.1]hept-5-en-2-ylmethoxy)methyl)oxirane (MGENB);
   b) an oxetane compound:

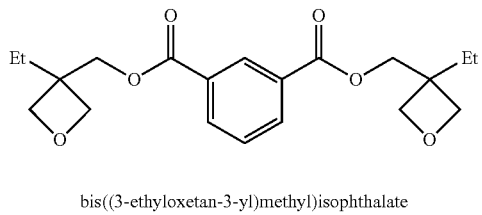 [SMILES: CCC1(COC(=O)c2cccc(C(=O)OCC3(CC)COC3)c2)COC1]

bis((3-ethyloxetan-3-yl)methyl)isophthalate c) a photoactive compound selected from the group consisting of:

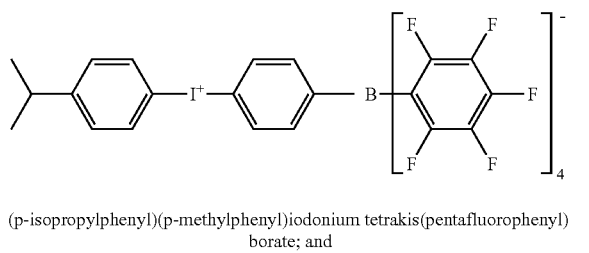

(p-isopropylphenyl)(p-methylphenyl)iodonium tetrakis(pentafluorophenyl)borate; and

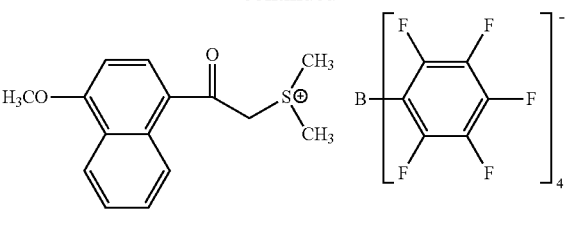

(2-(4-methoxynaphthalen-1-yl)-2-oxoethyl)dimethylsulfonium tetrakis(perfluorophenyl)borate;

and
   d) a carrier solvent.

2. The composition of claim 1, wherein the polymer is a copolymer containing repeating units derived from 5-decylbicyclo[2.2.1]hept-2-ene (DecNB) and 2-((bicyclo[2.2.1]hept-5-en-2-ylmethoxy)methyl)oxirane (MGENB).

3. The composition of claim 1, wherein the polymer is a terpolymer containing repeating units derived from 5-decylbicyclo[2.2.1]hept-2-ene (DecNB), 5-phenethylbicyclo[2.2.1]hept-2-ene (PENB) and 2-((bicyclo[2.2.1]hept-5-en-2-ylmethoxy)methyl)oxirane (MGENB).

4. The composition of claim 1, which further comprises one or more adhesion promoters selected from the group consisting of:

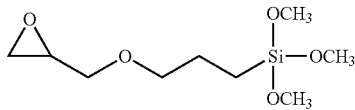

trimethoxy(3-(oxiran-2-ylmethoxy)propyl)silane; and

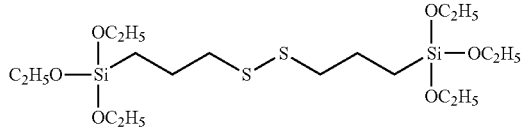

(bis(3-(triethoxysilyl)propyl)disulfide).

5. A photoimageable solvent developable negative tone composition comprising:
   a) a polymer selected from the group consisting of:
      a copolymer containing repeating units derived from 5-decylbicyclo[2.2.1]hept-2-ene (DecNB) and 2-((bicyclo[2.2.1]hept-5-en-2-ylmethoxy)methyl)oxirane (MGENB); and
      a terpolymer containing repeating units derived from 5-decylbicyclo[2.2.1]hept-2-ene (DecNB), 5-phenethylbicyclo[2.2.1]hept-2-ene (PENB) and 2-((bicyclo[2.2.1]hept-5-en-2-ylmethoxy)methyl)oxirane (MGENB);
   b) an oxetane compound selected from the group consisting of:
      a compound of formula (IIIA):

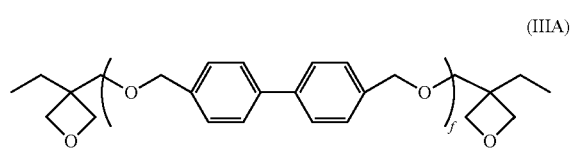

(IIIA)

wherein f is 1 or 2;

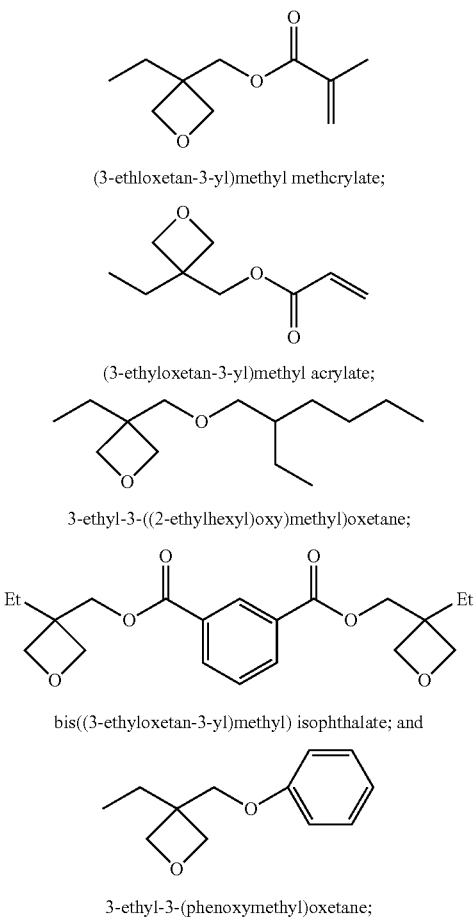

(3-ethloxetan-3-yl)methyl methcrylate;

(3-ethyloxetan-3-yl)methyl acrylate;

3-ethyl-3-((2-ethylhexyl)oxy)methyl)oxetane;

bis((3-ethyloxetan-3-yl)methyl) isophthalate; and 3-ethyl-3-(phenoxymethyl)oxetane;

c) a photoactive compound selected from the group consisting of:

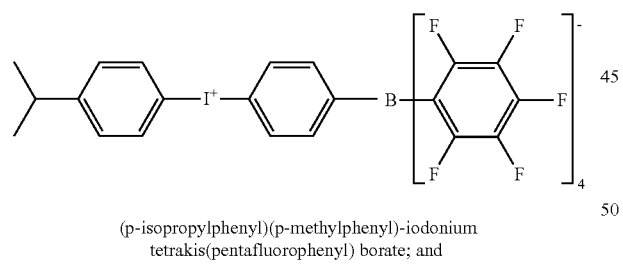

(p-isopropylphenyl)(p-methylphenyl)-iodonium tetrakis(pentafluorophenyl) borate; and

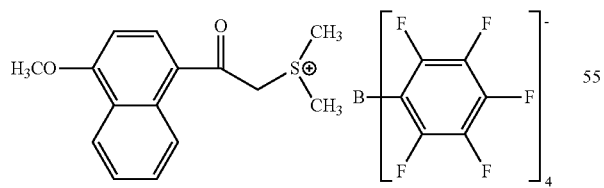

(2(4-methoxynaphthalen-1-yl)-2-oxoethyl)dimethylsulfonium tetrakis(perfluorophenyl)borate;

d) an adhesion promoter selected from the group consisting of:

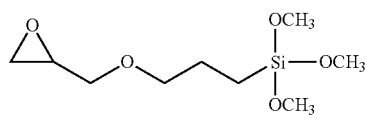

trimethoxy(3-(oxiran-2-ylmethoxy)propyl)silane; and

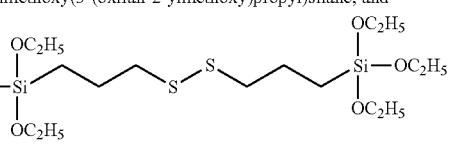

(bis(3-(triethoxysilyl)propyl)disulfide);

and e) a carrier solvent.

6. The composition of claim 5, wherein the polymer is a copolymer containing repeating units derived from 5-decyl-bicyclo[2.2.1]hept-2-ene (DecNB) and 2-((bicyclo[2.2.1]hept-5-en-2-ylmethoxy)methyl)oxirane (MGENB).

7. The composition of claim 5, wherein the polymer is a terpolymer containing repeating units derived from 5-decyl-bicyclo[2.2.1]hept-2-ene (DecNB), 5-phenethylbicyclo[2.2.1]hept-2-ene (PENB) and 2-((bicyclo [2 .2 .1] hept-5-en-2-ylmethoxy)methyl)oxirane (MGENB).

8. The composition of claim 5, wherein the oxetane compound is a compound of formula (IIIA):

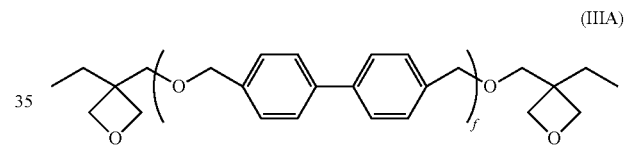

(IIIA)

wherein f is 1 or 2.

9. The composition of claim 5, wherein the oxetane compound is

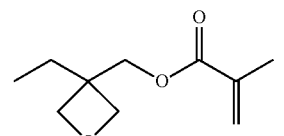

(3-ethyloxetan-3-yl)methyl methacrylate.

10. The composition of claim 5, wherein the oxetane compound is

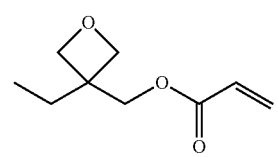

(3-ethyloxetan-3-yl)methyl acrylate.

11. The composition of claim 5, wherein the oxetane compound is

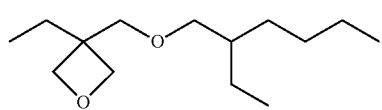

3-ethyl-3-(((2-ethylhexyl)oxy)methyl)oxetane.

12. The composition of claim 5, wherein the oxetane compound is

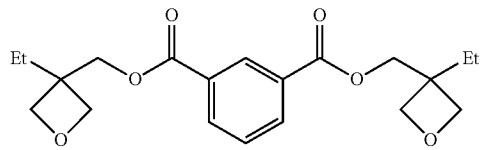

bis((3-ethyloxetan-3-yl)methyl) isophthalate.

13. The composition of claim 5, wherein the oxetane compound is

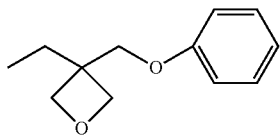

3-ethyl-3-(phenoxymethyl)oxetane.

14. The composition of claim 5, wherein the photoactive compound is

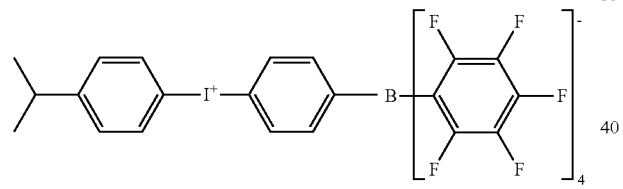

(p-isopropylphenyl)(p-methylphenyl)-iodonium tetrakis(pentafluorophenyl) borate.

15. The composition of claim 5, wherein the photoactive compound is

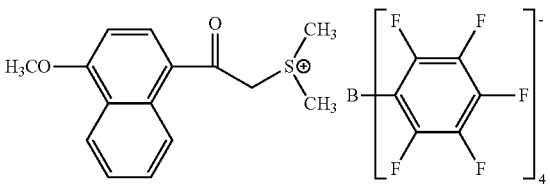

(2(4-methoxynaphthalen-1-yl)-2-oxoethyl)dimethylsulfonium tetrakis(perfluorophenyl)borate.

16. The composition of claim 5, wherein the adhesion promoter is

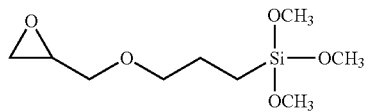

trimethoxy(3-(oxiran-2-ylmethoxy)propyl)silane.

17. The composition of claim 5, wherein the adhesion promoter is

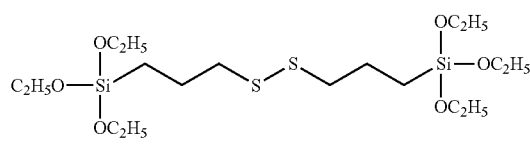

(bis(3-(triethoxysilyl)propyl)disulfide).

* * * * *